(12) United States Patent
Moran et al.

(10) Patent No.: US 12,106,705 B2
(45) Date of Patent: Oct. 1, 2024

(54) SPARSE LED ARRAY APPLICATIONS

(71) Applicant: Lumileds LLC, San Jose, CA (US)

(72) Inventors: Brendan Jude Moran, San Jose, CA (US); Johannes Willem Herman Sillevis Smitt, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 18/210,073

(22) Filed: Jun. 14, 2023

(65) Prior Publication Data

US 2023/0410727 A1 Dec. 21, 2023

Related U.S. Application Data

(60) Provisional application No. 63/420,872, filed on Oct. 31, 2022, provisional application No. 63/352,517, filed on Jun. 15, 2022.

(51) Int. Cl.
*G09G 3/32* (2016.01)
*B60K 35/00* (2024.01)
(Continued)

(52) U.S. Cl.
CPC ............... *G09G 3/32* (2013.01); *B60K 35/00* (2013.01); *G06F 3/011* (2013.01); *G06F 3/0412* (2013.01);
(Continued)

(58) Field of Classification Search
CPC ............... G09G 3/32; G09G 2300/026; G09G 2354/00; G09G 2370/06; G09G 2380/02; G06F 3/0412; G06F 3/1446
(Continued)

(56) References Cited

U.S. PATENT DOCUMENTS

| 2010/0026809 A1* | 2/2010 | Curry ............... H04N 23/698 348/157 |
| 2014/0172159 A1* | 6/2014 | Unmussig ............... G07F 11/64 700/232 |

(Continued)

FOREIGN PATENT DOCUMENTS

| KR | 200481943 | 11/2016 | |
| KR | 2018131362 A | * 12/2018 | ......... G06Q 30/0269 |

(Continued)

OTHER PUBLICATIONS

"International Application Serial No. PCT US2023 025343, International Search Report mailed Oct. 17, 2023", 3 pages.

(Continued)

*Primary Examiner* — Mark Edwards
(74) *Attorney, Agent, or Firm* — Schwegman, Lundberg & Woessner, P.A.

(57) ABSTRACT

A display that contains a sparse array of light-emitting diodes (LEDs), including a related system and method of fabrication are disclosed. The display includes at least one panel disposed in or on a transparent material to provide a display on one or both sides of the material. Each tile has a transparent flexible substrate, a sparse array of LEDs disposed on the transparent flexible substrate, a rigid substrate adhered to the transparent flexible substrate via an adhesive layer in which the sparse array of LEDs is encapsulated, and a driver disposed on an edge of the tile and configured to drive the LEDs. The LEDs are sparse enough to enable information to be displayed through the transparent material while still enabling a viewer to see through the transparent material.

23 Claims, 19 Drawing Sheets

(51) Int. Cl.
  *B60K 35/22* (2024.01)
  *G06F 3/01* (2006.01)
  *G06F 3/041* (2006.01)
  *G06F 3/14* (2006.01)
  *G09G 3/00* (2006.01)
  *G09G 3/20* (2006.01)
  *H01L 25/075* (2006.01)
  *H01L 25/16* (2023.01)
  *H01L 33/52* (2010.01)
  *H04N 23/53* (2023.01)

(52) U.S. Cl.
  CPC ........... *G06F 3/1446* (2013.01); *G09G 3/035* (2020.08); *G09G 3/2003* (2013.01); *H01L 25/0753* (2013.01); *H01L 25/167* (2013.01); *H01L 33/52* (2013.01); *H04N 23/53* (2023.01); *B60K 35/22* (2024.01); *B60K 2360/332* (2024.01); *G09G 2300/02* (2013.01); *G09G 2300/026* (2013.01); *G09G 2300/0426* (2013.01); *G09G 2300/0491* (2013.01); *G09G 2320/0233* (2013.01); *G09G 2320/028* (2013.01); *G09G 2320/0626* (2013.01); *G09G 2320/066* (2013.01); *G09G 2320/068* (2013.01); *G09G 2354/00* (2013.01); *G09G 2370/06* (2013.01); *G09G 2380/02* (2013.01); *G09G 2380/10* (2013.01)

(58) Field of Classification Search
  USPC .......................................................... 345/1.1
  See application file for complete search history.

(56) References Cited

U.S. PATENT DOCUMENTS

2017/0293380 A1\* 10/2017 Chauveau ............. G06F 3/0362
2018/0329511 A1\* 11/2018 Aman ................... G06F 3/0308
2019/0122263 A1\*  4/2019 Avakian ............... G06Q 10/087
2019/0333901 A1\* 10/2019 Cok ....................... H01L 25/167
2020/0057421 A1\*  2/2020 Trikha ...................... B32B 3/08
2020/0072441 A1\*  3/2020 Wu ........................ F21V 9/30
2020/0243738 A1\*  7/2020 Feng ..................... H01L 27/156
2021/0341810 A1\* 11/2021 Iwai .................. G02F 1/133302

FOREIGN PATENT DOCUMENTS

KR         20180131362          12/2018
KR           101956765           8/2019
KR           102051886          12/2019
KR         2022163025 A    \* 12/2022
WO     WO-2020204222 A1  \* 10/2020     ............... G09F 9/33

OTHER PUBLICATIONS

"International Application Serial No. PCT US2023 025343, Written Opinion mailed Oct. 17, 2023", 5 pages.

\* cited by examiner

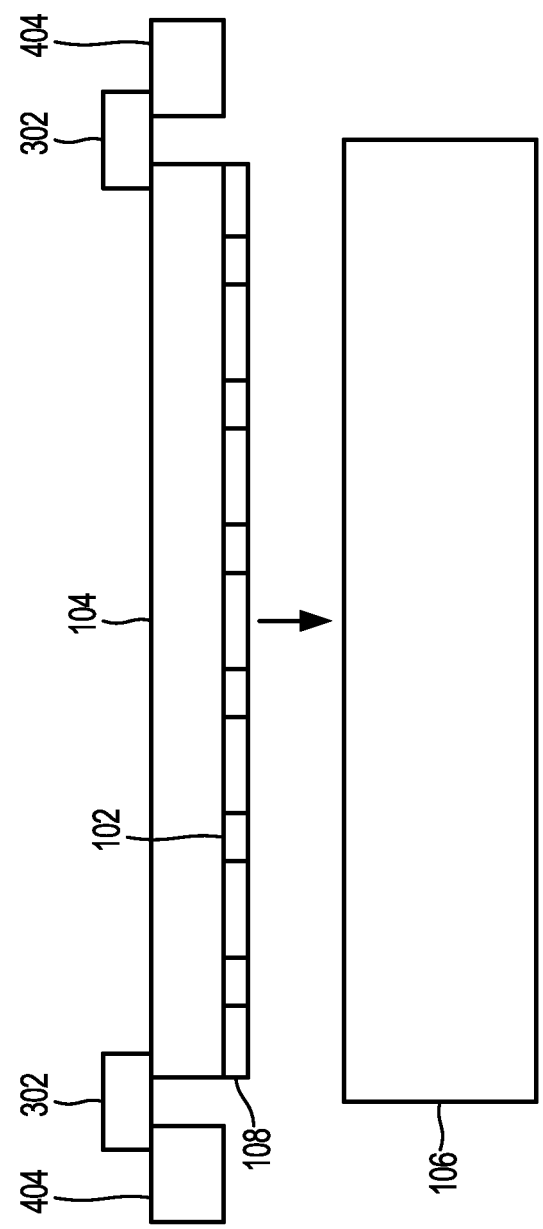

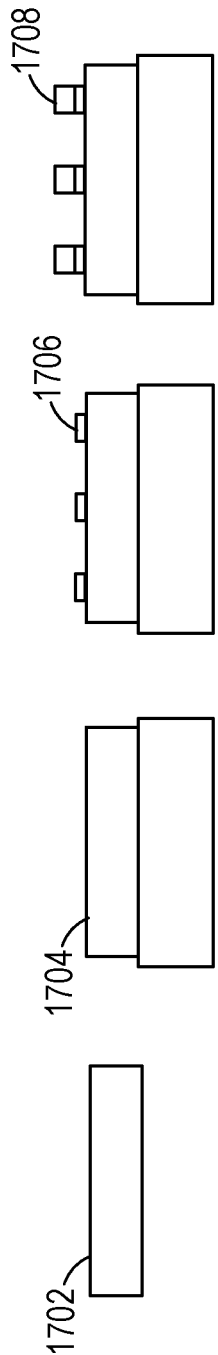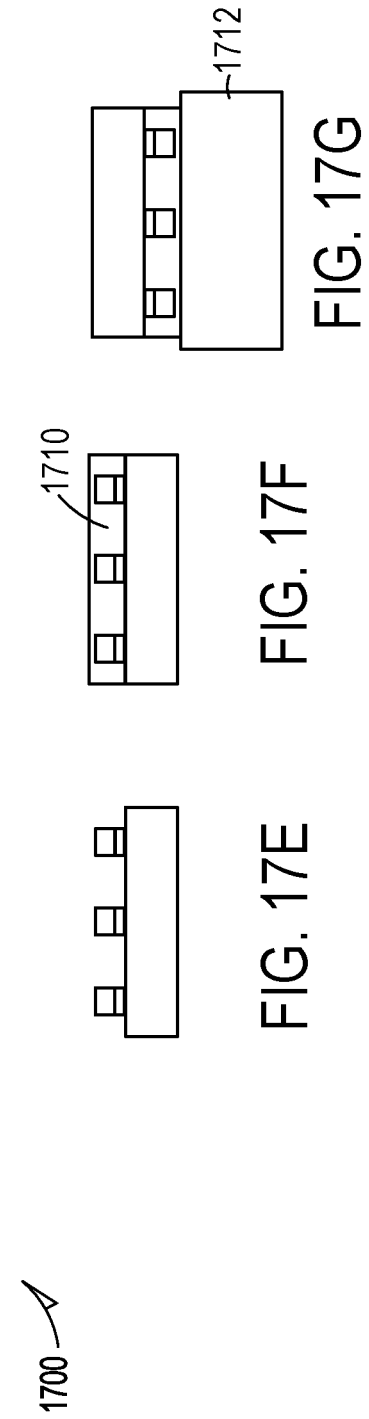

SPARSE LED ARRAY APPLICATIONS

PRIORITY

This patent application claims the benefit of priority to U.S. Provisional Patent Application Ser. No. 63/352,517, filed on Jun. 15, 2022, and U.S. Provisional Patent Application 63/420,872, filed on Oct. 31, 2022, each of which is hereby incorporated by reference herein in its entirety.

FIELD OF THE DISCLOSURE

The present disclosure relates to sparse light-emitting diodes (LEDs) arrays, systems, and applications.

BACKGROUND OF THE DISCLOSURE

LEDs provide an efficient and relatively smaller source of light compared to conventional light sources. The use of LEDs has evolved from systems that provide purely lighting to more complicated systems that use lighting. Consequently, there is ongoing effort to improve technology that uses LED arrays, as well as find additional uses for LED arrays.

BRIEF DESCRIPTION OF THE DRAWINGS

FIGS. 3 and 4 show side-view drawings of the light source of FIG. 1 in various stages of assembly in accordance with various embodiments of the disclosed subject-matter.

FIGS. 17A-17G show examples of process operations of fabricating the sparse array in accordance with some embodiments.

Corresponding reference characters indicate corresponding parts throughout the several views. Elements in the drawings are not necessarily drawn to scale. The configurations shown in the drawings are merely examples and should not be construed as limiting in any manner.

DETAILED DESCRIPTION

For the purposes of this document, the term "micro-LED" is intended to be synonymous with an LED of a sparse array of LEDs, as defined herein. There is ongoing effort to improve micro-LED display technology. For example, displays, such as direct-view displays and projection displays, can use micro-LEDs to improve efficiency and increase brightness.

In a direct-view micro-LED display, the LEDs may occupy a relatively small fraction of the display area. Because most of the display area is unaffected by the LEDs, the LEDs may not substantially alter the optical properties of the surface on which they are assembled. For example, a black surface may remain black in the presence of LEDs mounted on the black surface. Similarly, a reflective surface may remain reflective in the presence of LEDs mounted on the reflective surface. Other examples and optical surface properties can also be used.

In some examples, the micro-LEDs can be assembled onto a transparent flexible substrate. The transparent flexible substrate can then be laminated onto a substrate that has desired optical properties, such as being reflective, and so forth. Using the transparent flexible substrate in this manner can allow micro-LEDs to be applied to a curved or irregularly shaped substrate, which may not be compatible with micro-LED assembly technologies that use a rigid, flat substrate, such as a wafer. Note that the terms "substantially transparent" and "transparent" are used interchangeably herein to refer to materials (such as metal oxides or very thin metals) through which light from the microLEDs passes without being substantially (more than a few percent) absorbed or reflected.

In some examples, the flexible substrate can be laminated LED-side down onto the substrate, using a transparent adhesive that has sufficient thickness to encapsulate the micro-LEDs. For these examples and others, the transparent substrate and adhesive can also function as a barrier that can protect the micro-LEDs from the environment. Because the transparent substrate can provide protection for the micro-LEDs, the transparent substrate can reduce or eliminate the need to use an additional transparent cover or protection layer to provide the protection for the micro-LEDs.

Figure 1:
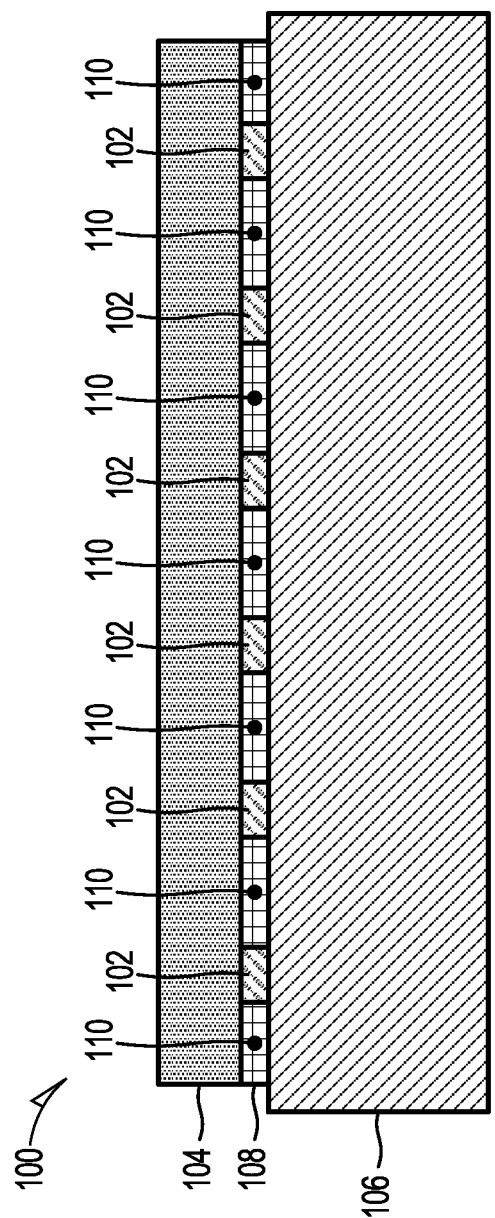
FIG. 1 shows a cross-sectional side view of an example of a light source in accordance with various embodiments of the disclosed subject-matter.

FIG. 1 shows a cross-sectional side view of an example of a light source 100. The light source 100 can include a sparse array of LEDs 102 (e.g., "micro-LEDs") disposed on a transparent flexible substrate 104, and a rigid substrate 106 adhered to the transparent flexible substrate 104 with an adhesive layer 108 such that the sparse array of LEDs 102 is located between the rigid substrate 106 and the transparent flexible substrate 104. The sparse array of LEDs 102 can be encapsulated in the adhesive 110 of the adhesive layer 108.

The transparent flexible substrate 104 can be a polymer sheet with a relatively high transmittance, or, equivalently, relatively low losses due to absorption and scattering in the visible portion of the electromagnetic spectrum, such as between wavelengths of about 400 nm and about 700 nm. Suitable materials for the transparent flexible substrate 104 can include clear polyimide (PI), polyethylene naphthalate (PEN), polyethylene terephthalate (PET) and others. The transparent flexible substrate 104 can have a thickness between about 20 μm and about 200 μm, although a thickness outside this range of thicknesses can also be used.

The sparse array of LEDs 102 can be disposed on the transparent flexible substrate 104. For the purposes of this document, the term sparse is intended to signify that a light-producing surface area of the array is less, or significantly less, than a total surface area of the array. For example, a fill factor of the array (e.g., a ratio of light-producing surface area to full surface area) can be less than or equal to a specified threshold, such as 10%, 5%, 4%, 3%, 2%, 1%, or another suitable threshold. As a specific example, the LEDs 102 can be arranged in a rectangular array, with center-to-center spacing along one dimension denoted by spacing x. Each LED 102 can have a light-producing area sized along the one dimension by size s. The ratio of s divided by x can be less than or equal to 0.1. In an orthogonal dimension, a similar ratio applies, with the linear size of a light-producing area being less than or equal to one-tenth the linear center-to-center spacing of the LEDs 102. Combining the two linear dimensions, the surface area of the light-producing areas of the LEDs 102 is less than or equal to 1% of the surface area of the array. In some examples, the light-producing area of each LED can be smaller than 200 μm on a side. In some examples, the light-producing area of each LED can be smaller than 50 μm on a side. Electrical traces can be deposited on the transparent flexible substrate 104 to electrically power (e.g., carry current to and from) the LEDs 102. In some examples, the electrical traces can be metal traces that are narrow enough to be invisible under typical viewing conditions. In some examples the electrical traces can be formed from one or more transparent electrically conductive materials, such as indium tin oxide (ITO).

In some examples, the sparse array of LEDs 102 can include two or more LEDs 102 that emit light at a same wavelength (or color). In some examples, the sparse array of LEDs 102 can include LEDs 102 that all emit light at a same wavelength. For example, a device, such as a display, can include a sparse array of LEDs 102 that all emit red light, a sparse array of LEDs 102 that all emit green light, and a sparse array of LEDs 102 that all emit blue light. In some examples, the sparse array of LEDs 102 can include two or more LEDs 102 that emit light at different wavelengths. For example, a device, such as a display, can include a sparse array of LEDs 102 in which some LEDs 102 emit red light, some LEDs 102 emit green light, and some LEDs 102 can emit blue light. The red, green, and blue LEDs 102 can be arranged in repeating clusters, with each cluster forming a color pixel of the device. In some examples, the sparse array of LEDs 102 can include at least one LED that emits light at a visible wavelength (e.g., between about 400 nm and about 700 nm). In some examples, the sparse array of LEDs 102 can include at least one LED that emits light at an infrared wavelength (e.g., greater than about 700 nm). Such infrared wavelengths can be used for biometric sensing or other sensing techniques.

Because the sparse array of LEDs 102, including the light-emitting area of the LEDs 102, the corresponding electrical traces, and any corresponding circuitry, can have a relatively small fill factor, most of the surface area of the sparse array of LEDs 102 can be transparent. For example, light incident on the sparse array of LEDs 102, either incident from the transparent flexible substrate 104 or incident on the transparent flexible substrate 104, mostly passes through the sparse array of LEDs 102, with only a relatively small fraction being blocked by the light-emitting areas and electrical traces of the sparse array of LEDs 102.

As a result, the sparse array of LEDs 102 can produce light on a surface and/or an optical element that has an additional function, such as on the rigid substrate 106, described below. For example, the surface and/or optical element can include a reflector that has a specified value of reflectance. As another example, the surface and/or optical element can include a spectral filter that has a specified reflectance, transmittance, or absorptance at one or more specified wavelengths. Other suitable functions can also be used.

The rigid substrate 106 can be adhered to the transparent flexible substrate 104. In some examples, the rigid substrate 106 can be transparent. Suitable applications for a transparent rigid substrate 106 can include a building window, a heads-up display, an augmented reality headset, and others. Suitable transparent materials for a transparent rigid substrate 106 can include glass, laminated glass, polycarbonate, or an engineering plastic such as poly(methyl methacrylate) (PMMA).

In some examples, the rigid substrate 106 can be reflective. In some examples, the rigid surface can be specularly reflective (e.g., can have a relatively smooth reflective surface that causes relatively little scattering or diffusion upon reflection). Suitable applications for a reflective rigid substrate 106 can include a mirror, such as a vehicular rear-view mirror or side-view mirror that can display information. Specifically, the specularly reflective surface of the rigid substrate 106 can perform the function of reflecting light from the rear of a vehicle, while the sparse array of LEDs 102 can display information superimposed on the reflected light.

In some examples, the rigid substrate 106 can be protective and/or decorative, such as a case material of a mobile device, such as a smart phone. The rigid substrate 106 can include other suitable optical properties and perform other suitable functions as well.

The rigid substrate 106 can be flat (e.g., substantially flat) or curved. Curved substrates can be used in vehicle windshields, augmented reality headsets, wearables, or other suitable devices. In some examples, the rigid substrate 106 is formed as a single unitary body. In other examples, the rigid substrate 106 can include multiple rigid substrate elements. For example, multiple rigid substrate elements can be used to create a folding display in a smartphone or other mobile device. Custom tooling can support such curved substrates in the lamination process, described below.

The adhesive can adhere the rigid substrate 106 to the transparent flexible substrate 104. In some examples, the adhesive can be formed as an adhesive layer 108 such that the sparse array of LEDs 102 is located between the rigid substrate 106 and the transparent flexible substrate 104. Other suitable configurations can also be used. Suitable materials for the adhesive of the adhesive layer 108 can include silicone, epoxy silicone, an acrylic film, an epoxy film, and others.

In some examples, the adhesive of the adhesive layer 108 can be formed from a material having a refractive index that can match or substantially match a refractive index of the transparent flexible substrate 104 and/or the rigid substrate 106 or can fall between refractive indices of the transparent flexible substrate 104 and the rigid substrate 106. Selecting a refractive index in this manner can reduce or eliminate reflections at the interface between the adhesive layer 108 and the transparent flexible substrate 104 and/or at the interface between the adhesive layer 108 and the rigid substrate 106. For example, the adhesive of the adhesive layer 108 can be formed from a material having a refractive index between about 1.4 and about 1.7. Using a refractive index in the range of about 1.4 to about 1.7 can reduce unwanted reflections between the adhesive layer 108 and the transparent flexible substrate 104 and unwanted reflections between the adhesive layer 108 and the rigid substrate 106. Optional thin-film anti-reflection coatings can also be used to help reduce or eliminate unwanted reflections at one or more interfaces between adjacent differing materials or between a material and air.

In some examples, the adhesive layer 108 can fully encapsulate the sparse array of LEDs 102. By fully encapsulating the sparse array of LEDs 102, the adhesive layer 108 can protect the sparse array of LEDs 102 from the environment and can form a smooth, unbroken interface with the rigid substrate 106. To fully encapsulate the sparse array of LEDs 102, the adhesive of the adhesive layer 108 can have a resin viscosity that is low enough such that the adhesive flows around the LEDs 102 as the adhesive is deposited. In addition, to fully encapsulate the sparse array of LEDs 102, the adhesive layer 108 can be thick enough to fully cover the topography of the sparse array of LEDs 102.

Figure 2:
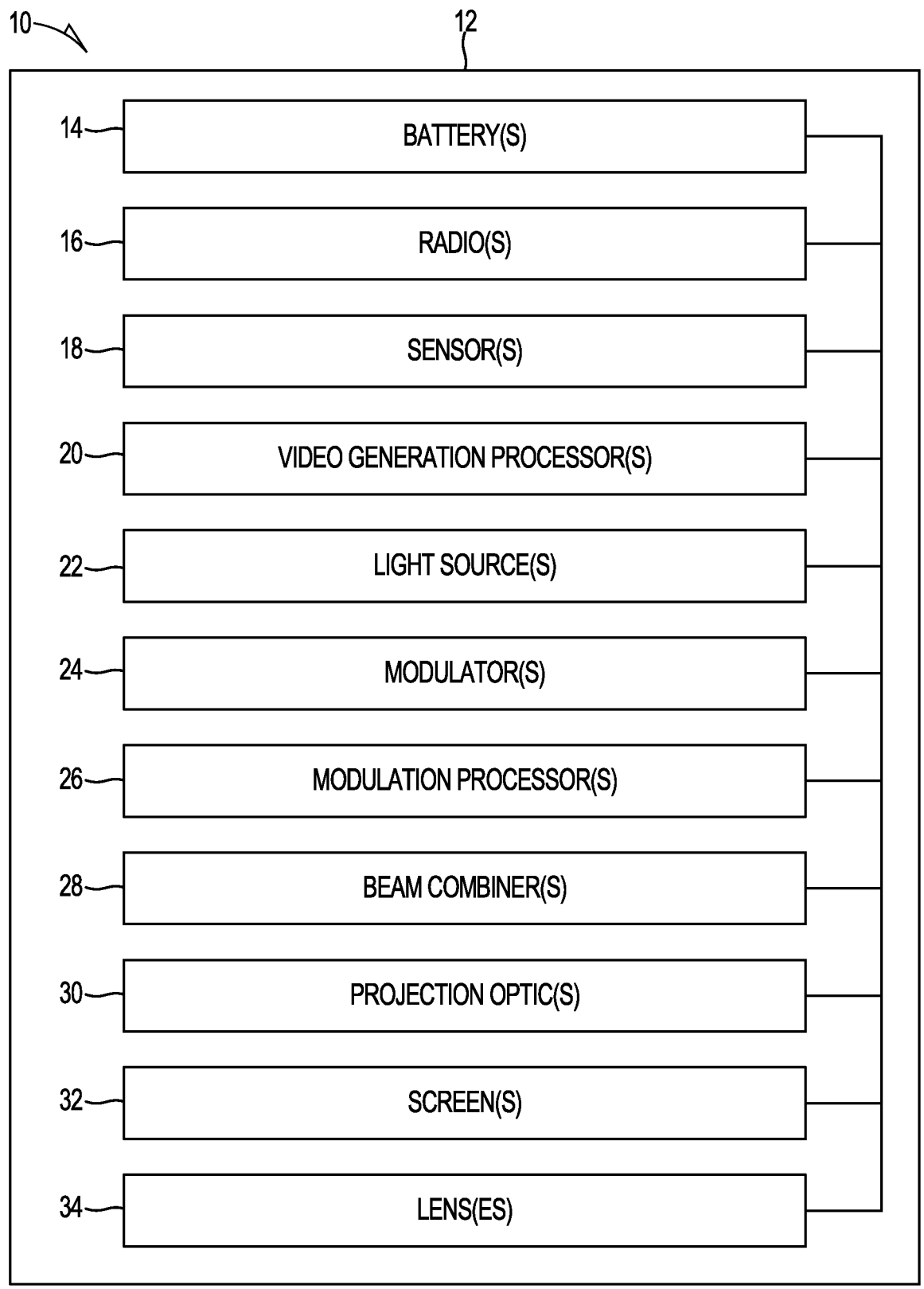
FIG. 2 shows a block diagram of an example of a visualization system, which can include the light source of FIG. 1.

FIG. 2 shows a block diagram of an example of a visualization system 10, which can include the light source 100 of FIG. 1. The visualization system 10 can include a wearable housing 12, such as a headset or goggles. The housing 12 can mechanically support and house the elements detailed below. In some examples, one or more of the elements detailed below can be included in one or more additional housings that can be separate from the wearable housing 12 and couplable to the wearable housing 12 wirelessly and/or via a wired connection. For example, a separate housing can reduce the weight of wearable goggles, such as by including batteries, radios, and other elements. The housing 12 can include one or more batteries 14, which can electrically power any or all of the elements detailed below. The housing 12 can include circuitry that can electrically couple to an external power supply, such as a wall outlet, to recharge the batteries 14. The housing 12 can include one or more radios 16 to communicate wirelessly with a server or network via a suitable protocol, such as WiFi.

The visualization system 10 can include one or more sensors 18, such as optical sensors, audio sensors, tactile sensors, thermal sensors, gyroscopic sensors, time-of-flight sensors, triangulation-based sensors, and others. In some examples, one or more of the sensors can sense a location, a position, and/or an orientation of a user. In some examples, one or more of the sensors 18 can produce a sensor signal in response to the sensed location, position, and/or orientation. The sensor signal can include sensor data that corresponds to a sensed location, position, and/or orientation. For example, the sensor data can include a depth map of the surroundings. In some examples, such as for an augmented reality system, one or more of the sensors 18 can capture a real-time video image of the surroundings proximate a user.

The visualization system 10 can include one or more video generation processors 20. The one or more video generation processors 20 may receive, from a server and/or a storage medium, scene data that represents a three-dimensional scene, such as a set of position coordinates for objects in the scene or a depth map of the scene. The one or more video generation processors 20 can receive one or more sensor signals from the one or more sensors 18. In response to the scene data, which represents the surroundings, and at least one sensor signal, which represents the location and/or orientation of the user with respect to the surroundings, the one or more video generation processors 20 can generate at least one video signal that corresponds to a view of the scene. In some examples, the one or more video generation processors 20 can generate two video signals, one for each eye of the user, that represent a view of the scene from a point of view of the left eye and the right eye of the user, respectively. In some examples, the one or more video generation processors 20 can generate more than two video signals and combine the video signals to provide one video signal for both eyes, two video signals for the two eyes, or other combinations.

The visualization system 10 can include one or more light sources 22 (such as the light source 100 of FIG. 1) that can provide light for a display of the visualization system 10. Suitable light sources 22 can include a light-emitting diode, a monolithic light-emitting diode, a plurality of light-emitting diodes, an array of light-emitting diodes, an array of light-emitting diodes disposed on a common substrate, a segmented light-emitting diode that is disposed on a single substrate and has light-emitting diode elements that are individually addressable and controllable (and/or controllable in groups and/or subsets), an array of micro-light-emitting diodes (microLEDs), and others. In some examples, one or more of the light sources 22 can include a sparse array of LEDs disposed on a transparent flexible substrate, and a rigid substrate adhered to the transparent flexible substrate with an adhesive layer such that the sparse array of LEDs is located between the rigid substrate and the transparent flexible substrate.

A light-emitting diode can be white-light light-emitting diode. For example, a white-light light-emitting diode can emit excitation light, such as blue light or violet light. The white-light light-emitting diode can include one or more phosphors that can absorb some or all of the excitation light and can, in response, emit phosphor light, such as yellow light, that has a wavelength greater than a wavelength of the excitation light.

The one or more light sources 22 can include light-producing elements having different colors or wavelengths. For example, a light source can include a red light-emitting diode that can emit red light, a green light-emitting diode that can emit green light, and a blue light-emitting diode that can emit blue right. The red, green, and blue light combine in specified ratios to produce any suitable color that is visually perceptible in a visible portion of the electromagnetic spectrum.

The visualization system 10 can include one or more modulators 24. The modulators 24 can be implemented in one of at least two configurations.

In a first configuration, the modulators 24 can include circuitry that can modulate the light sources 22 directly. For example, the light sources 22 can include an array of light-emitting diodes, and the modulators 24 can directly modulate the electrical power, electrical voltage, and/or electrical current directed to each light-emitting diode in the array to form modulated light. The modulation can be performed in an analog manner and/or a digital manner. In some examples, the light sources 22 can include an array of red light-emitting diodes, an array of green light-emitting diodes, and an array of blue light-emitting diodes, and the modulators 24 can directly modulate the red light-emitting diodes, the green light-emitting diodes, and the blue light-emitting diodes to form the modulated light to produce a specified image.

In a second configuration, the modulators 24 can include a modulation panel, such as a liquid crystal panel. The light sources 22 can produce uniform illumination, or nearly uniform illumination, to illuminate the modulation panel. The modulation panel can include pixels. Each pixel can selectively attenuate a respective portion of the modulation panel area in response to an electrical modulation signal to form the modulated light. In some examples, the modulators 24 can include multiple modulation panels that can modulate different colors of light. For example, the modulators 24 can include a red modulation panel that can attenuate red light from a red light source such as a red light-emitting diode, a green modulation panel that can attenuate green light from a green light source such as a green light-emitting diode, and a blue modulation panel that can attenuate blue light from a blue light source such as a blue light-emitting diode.

In some examples of the second configuration, the modulators 24 can receive uniform white light or nearly uniform white light from a white light source, such as a white-light light-emitting diode. The modulation panel can include wavelength-selective filters on each pixel of the modulation panel. The panel pixels can be arranged in groups (such as groups of three or four), where each group can form a pixel of a color image. For example, each group can include a panel pixel with a red color filter, a panel pixel with a green color filter, and a panel pixel with a blue color filter. Other suitable configurations can also be used.

The visualization system 10 can include one or more modulation processors 26, which can receive a video signal, such as from the one or more video generation processors 20, and, in response, can produce an electrical modulation signal. For configurations in which the modulators 24 directly modulate the light sources 22, the electrical modulation signal can drive the light sources 24. For configurations in which the modulators 24 include a modulation panel, the electrical modulation signal can drive the modulation panel.

The visualization system 10 can include one or more beam combiners 28 (also known as beam splitters 28), which can combine light beams of different colors to form a single multi-color beam. For configurations in which the light sources 22 can include multiple light-emitting diodes of different colors, the visualization system 10 can include one or more wavelength-sensitive (e.g., dichroic) beam splitters 28 that can combine the light of different colors to form a single multi-color beam.

The visualization system 10 can direct the modulated light toward the eyes of the viewer in one of at least two configurations. In a first configuration, the visualization system 10 can function as a projector, and can include suitable projection optics 30 that can project the modulated light onto one or more screens 32. The screens 32 can be located a suitable distance from an eye of the user. The visualization system 10 can optionally include one or more lenses 34 that can locate a virtual image of a screen 32 at a suitable distance from the eye, such as a close-focus distance, such as 500 mm, 750 mm, or another suitable distance. In some examples, the visualization system 10 can include a single screen 32, such that the modulated light can be directed toward both eyes of the user. In some examples, the visualization system 10 can include two screens 32, such that the modulated light from each screen 32 can be directed toward a respective eye of the user. In some examples, the visualization system 10 can include more than two screens 32. In a second configuration, the visualization system 10 can direct the modulated light directly into one or both eyes of a viewer. For example, the projection optics 30 can form an image on a retina of an eye of the user, or an image on each retina of the two eyes of the user.

For some configurations of augmented reality systems, the visualization system 10 can include an at least partially transparent display, such that a user can view the user's surroundings through the display. For such configurations, the augmented reality system can produce modulated light that corresponds to the augmentation of the surroundings, rather than the surroundings itself. For example, in the example of a retailer showing a chair, the augmented reality system can direct modulated light, corresponding to the chair but not the rest of the room, toward a screen or toward an eye of a user.

Figure 3:
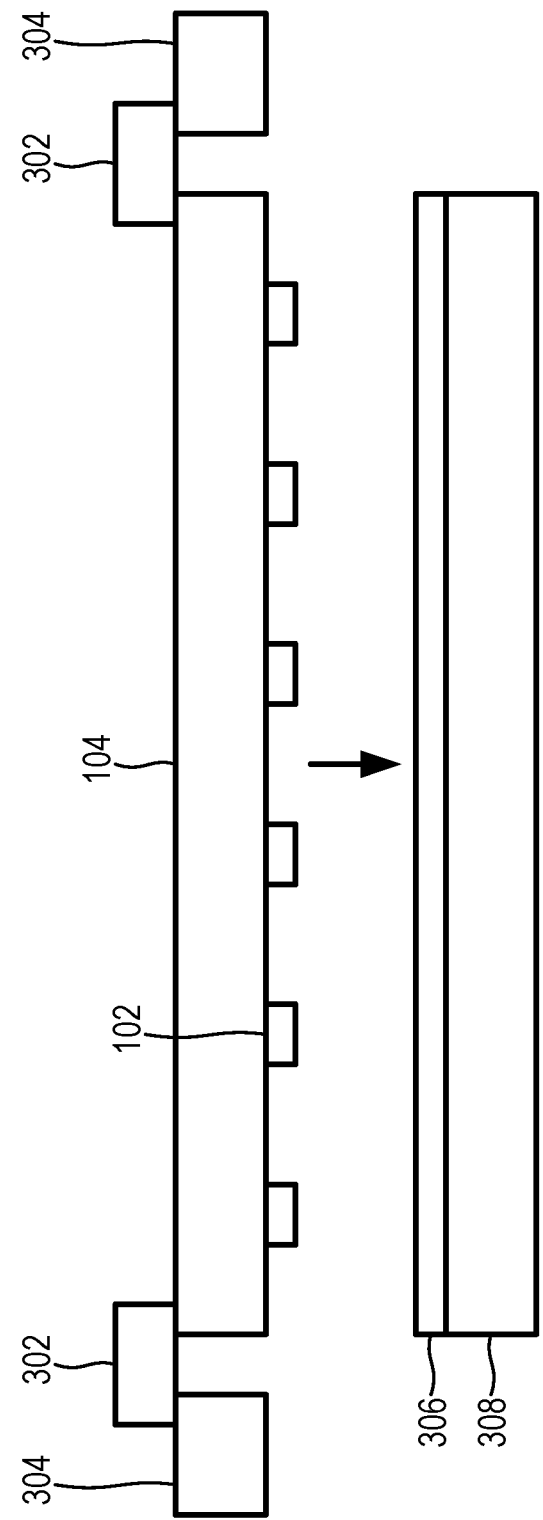

FIGS. 3 and 4 show side-view drawings of the light source 100 of FIG. 1 in various stages of assembly. Assembling the light source 100 in this manner can help avoid air occlusions, which can degrade the appearance and optical performance of the finished device. Other assembly techniques can also be used.

In FIG. 3, a sparse array of LEDs 102 has been disposed (e.g., mounted, grown, deposited, or otherwise formed) on the transparent flexible substrate 104. The transparent flexible substrate 104 has been removably mounted in or on a frame 302. Lamination tooling 304 can advance the frame 302 toward an adhesive layer 306 that has been deposited on a support film 308. Alternatively, the lamination tooling 304 can advance the adhesive layer 306 toward the frame 302, or advance both toward each other. The sparse array of LEDs 102 will contact the adhesive layer 306, which has been deposited on the support film 308. The adhesive of the adhesive layer 306 can be in solid form at room temperature. The adhesive has been coated on the support film 308 and has been covered by a cover film (not shown). A vacuum laminator with a temperature range that allows the adhesive to flow and conformally cover the LED array topography can laminate the adhesive layer 306 onto the sparse array of LEDs 102 to encapsulate the sparse array of LEDs 102 in the adhesive layer 108. After lamination, the support film 308 can then be removed.

In FIG. 4, the lamination tooling 404 (optionally the same lamination tooling 304 as in FIG. 3) can advance the transparent flexible substrate 104 and the adhesive layer 108, with the sparse array of LEDs 102 encapsulated in the adhesive layer 108, toward the rigid substrate 106. Alternatively, the lamination tooling 404 can advance the rigid substrate 106 toward the transparent flexible substrate 104 and the adhesive layer 108, or advance both toward each other. The lamination tooling can laminate the adhesive layer 108, with the sparse array of LEDs 102 encapsulated in the adhesive layer 108, onto the rigid substrate 106. After the adhesive layer 108 has been laminated onto the rigid substrate 106, the full layered structure can be subjected to a temperature cycle, exposure to ultraviolet light, or other suitable curing technique to cure the adhesive.

In the examples described above, the transparent flexible substrate 104 has been laminated with the LED side facing the rigid substrate 106, such that the LEDs 102 are located between the two substrates and encapsulated by the adhesive. Alternatively, the transparent flexible substrate 104 can be laminated with the LED side facing away from the rigid substrate 106, such that the LEDs 102 are exposed, and the transparent flexible substrate 104 is located between the exposed LEDs 102 and the rigid substrate 106.

In some examples, additional components can be assembled onto the transparent flexible substrate, such as integrated circuits (ICs), micro-ICs, or transistors for display backplanes. Moreover, additional layers may be integrated into a device to form a capacitive or resistive touchscreen.

In some embodiments, an LED includes multiple semiconductor layers grown on a substrate (e.g., a sapphire substrate) that are to be fabricated into pixels. The substrate may be any substrate, such as sapphire, capable of having epitaxial layers grown thereon. The substrate may have patterns on which the epitaxial layers are grown. The pixels may be formed from gallium nitride (GaN), having an n-type semiconductor adjacent to the substrate, a p-type semiconductor, and an active region between the n-type semiconductor and the p-type semiconductor. The active region may be, for example, a multiple quantum well structure in which light is generated for emission from the pixels. After processing, the substrate may be removed in some embodiments.

Before etching of the epitaxial GaN layers, die layers of chip-scale packages (CSP) allowing uniform current distribution and optical coupling may be deposited or otherwise formed. For example, uniform current injection in the p-type semiconductor may be obtained by depositing a transparent conductive oxide (TCO) layer such as indium tin oxide (ITO), indium zinc oxide (IZO), zinc oxide (ZnO), or tin oxide (SnO) on the p-type semiconductor.

Figure 5A:
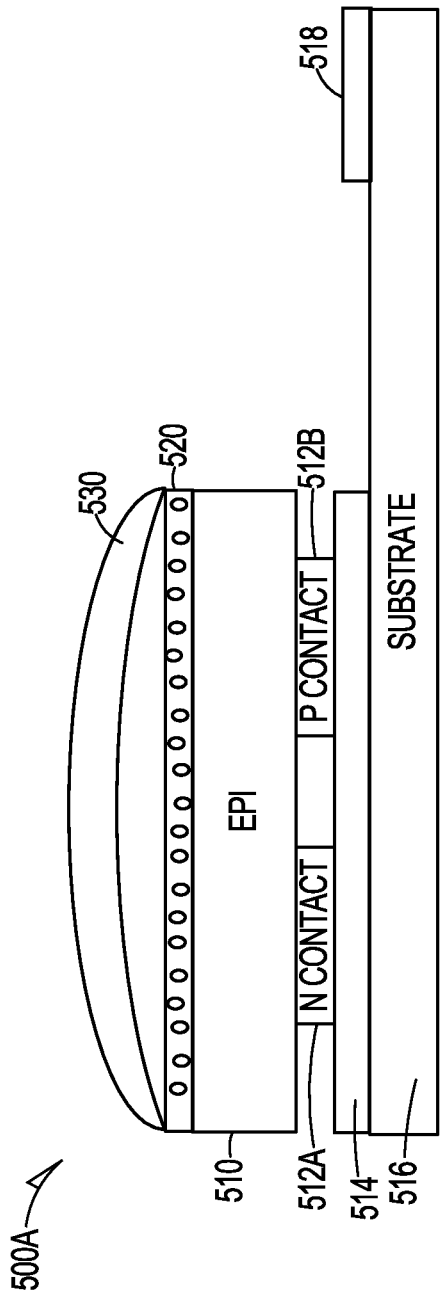
FIG. 5A illustrates a cross-sectional view of an example of an LED of a sparse array, in accordance with some examples.

FIG. 5A illustrates a cross-sectional view of an LED 500a of a sparse array, in accordance with some examples. The LED 500a may contain an epitaxial stack 510 of n-type and p-type semiconductors (e.g., GaN, InGaN, AlInGaP, GaAs, InGaAs). The thickness of the epitaxial stack 510 may range from about 3 μm to about 15 μm, typically about 5 μm. The n-type semiconductor and p-type semiconductor of the epitaxial stack 510 may make electrical contact to traces 514 on a substrate 516 via an n-contact 512a and a p-contact 512b, respectively. The n-contact 512a and p-contact 512b (or interconnect material) may be formed from a metal or compound such as Au, Sn, AuSn, In, Anisotropic conductive film (ACF)/ACInk, Self-Aligned Contact (SAC). The thickness of the contact 512a and p-contact 512b may range from about 0.02 μm to about 5 μm, typically about 0.1 μm. The traces 514 may be formed from a TCO material. The thickness of the traces 514 may range from about 0.5 μm to about 10 μm, typically about 1 μm. The n-contact 512a and p-contact 512b may be patterned and formed from a metal, such as copper (Cu), nickel (Ni), gold (Au), silver (Ag), and/or titanium (Ti), for example, which may be deposited on the epitaxial stack 510. The substrate 516 may be the rigid or flexible substrate described above formed, for example, from glass, PET, or clear polyimide. The thickness of the substrate 516 may range from about 50 μm to about 1000 μm, typically about 100 μm. Metallic conductors 518 may make contact to the traces 514 to route power and other signals to the epitaxial stack 510. The metallic conductors 518 may be formed from a metal or compound such as Au, Cu, Al, Ti, Ni, or Mo. The thickness of the metallic conductors 518 may range from about 0.5 μm to about 30 μm, typically about 1 μm.

In some embodiments, a light-converting layer 520 containing phosphor particles may be disposed on or adjacent to the epitaxial stack 510. The light-converting layer 520 may convert the light emitted by the epitaxial stack 510 to white light, for example.

A lens 530 and/or other optical elements may be disposed over the epitaxial stack 510 as shown. The lens 530 and/or other optical elements may be incorporated in the adhesive layer. Although not shown, the other substrate may be disposed on the lens 530.

Figure 5B:
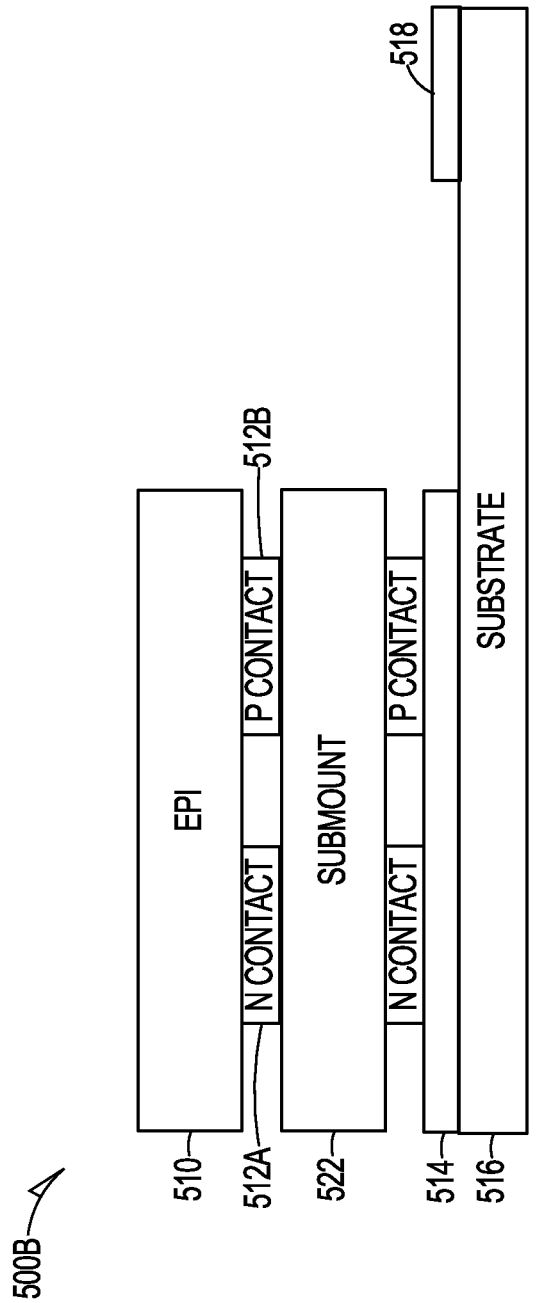
FIG. 5B illustrates a cross-sectional view of an example of an LED of another sparse array, in accordance with some examples.

FIG. 5B illustrates a cross-sectional view of an LED 500b of another sparse array, in accordance with some examples. As indicated, the difference between the LED 500b of FIG. 5B and the LED 500a of FIG. 5A is the presence of a submount 522 (the optional light-converting layer 520 and lens 530 are not shown in FIG. 5B for convenience). The submount 522 may be a rigid substrate formed, for example, from glass or silicon. The thickness of the submount 522 may range from about 5 μm to about 100 μm, typically about 20 μm. The interconnect material may be the same on both sides of the submount 522.

In some embodiments, vertical singulated LEDs may have a smallest x-y dimensions of about 3 μm×about 3 μm and a largest x-y dimensions of about 15 μm×about 15 μm. Lateral and flip chip LEDs may have a smallest x-y dimensions of about 3 μm×about 6 μm and a largest x-y dimensions of about 50 μm×about 75 μm. In this case, a 127 μm×127 μm panel having a 200 pixels per inch (PPI) with a 40×40 μm microIC, 25×25 μm LED submount, 2×10 μm×127 μm traces to supply the microIC, 2×10 μm×<50 μm traces to supply LEDs, the total opaque or semi-opaque area of a tile is 5765 μm², the total area per pixel in 200 ppi is 16129 μm², and the fractional area is 35% covered, 65% transparent. Similarly, a 362 μm×362 μm panel having a 70 pixels per inch (PPI) with a 40×40 μm microIC, 25×25 μm LED submount, 2×10 μm×362 μm traces to supply the microIC, 2×10 μm×<150 μm traces to supply LEDs, the total opaque or semi-opaque area of the tile is 12465 μm², the total area per pixel in 70 ppi is 131044 μm², and the fractional area is 10% covered, 90% transparent. Either of these may provide panels with sufficient transparency to see through the panel. That is, in a sparse display, a distance between LEDs of the sparse array of LEDs permits display of at least one of alphanumeric and image information while providing visibility through the transparent material.

Figure 6:
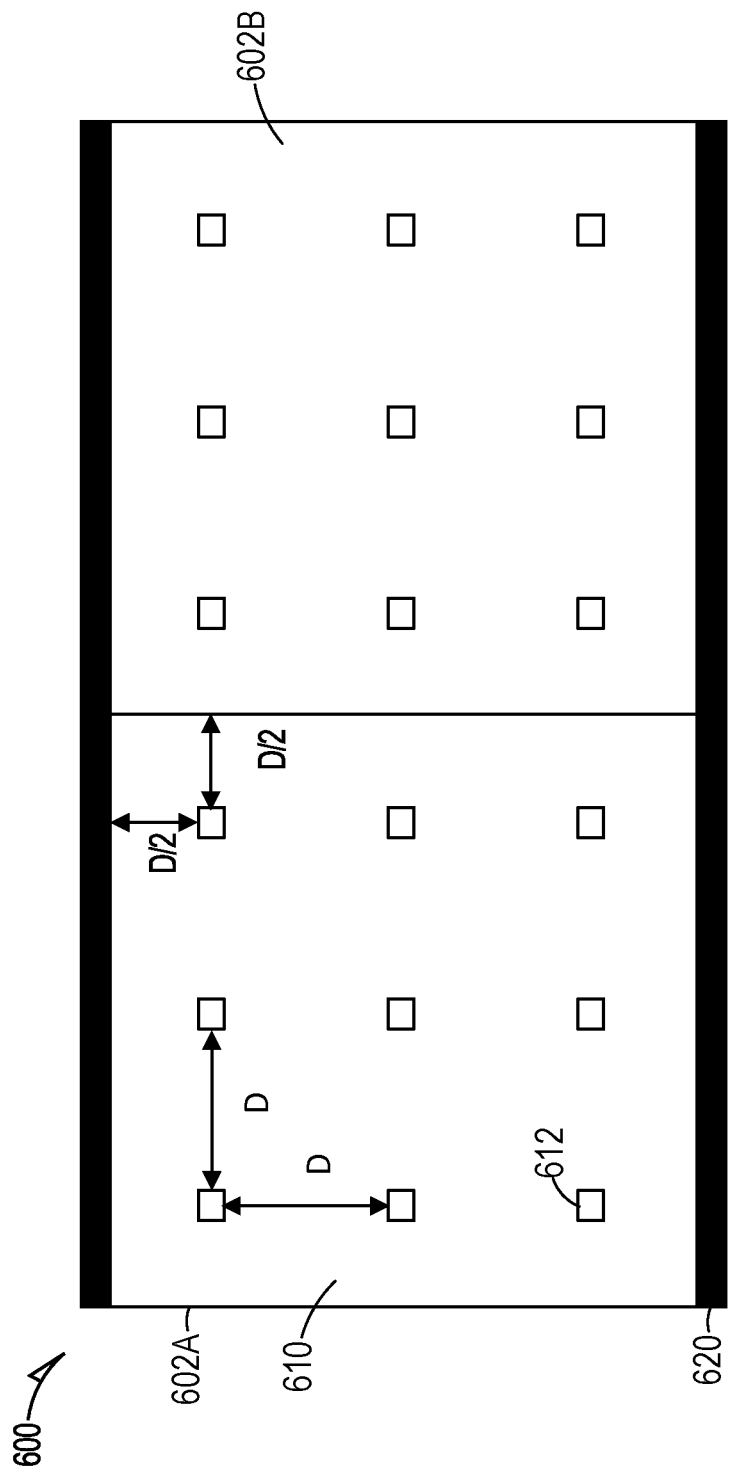
FIG. 6 shows a top view of an example of a panel in accordance with various embodiments of the disclosed subject-matter.

FIG. 6 shows a top view of an example of a panel in accordance with various embodiments of the disclosed subject-matter. The panel 600 contains multiple adjacent (touching) tiles 602a, 602b. Each tile 602a, 602b contains an LED array 610. Each LED array 610 contains multiple LEDs 612 arranged in a sparse distribution, similar to that described above. Each LED 612 may emit light of the same color or may emit different light of different colors. The electrical connections between the LEDs 612 and from LEDs 612 to other (external) components such as a driver are not shown for convenience. Multiple LEDs 612 of different colors may be arranged at each individual (pixel) location of the LEDs 612.

As shown, the panel 600 may be formed from adjacent LED arrays 610 (tiles 602a, 602b). In some embodiments, each LED array 610 may be of the same size and may have the same number of LEDs 612. The LEDs 612 within each LED array 610 may be separated by a uniform distance D in both orthogonal (x-y) directions. Each LED 612 closest to the edge in each LED array 610 is disposed is disposed at half the uniform distance D/2 from the edge of the LED array 610.

Although the LEDs 612 are shown in FIG. 6 as being disposed in a square LED array 610 (i.e., the number of LEDs 612 are the same in each orthogonal direction) any shaped LED array (e.g., rectangular, triangular) may be used in the panel 600 so long as the LED arrays are able to fit together to be in contact on all sides with another LED array and the spacing between the LEDs 612 remains constant. Drivers and other control circuitry may be disposed at one electronics edge 620 or opposing edges of each tile 602a, 602b. The electronics edge 620 may be orthogonal to a common edge between the tiles 602a, 602b. The electronics edge 620 may contain multiple drivers that are each configured to drive one or more microLEDs in each pixel.

Thus, a display formed by the panel 600 may essentially be edgeless. That is, at most three sides may be free from any visible power conductors or signal busses. Such a display may be formed from multiple tiles 602a, 602b having essentially identical characteristics and uniform distance between pixels (LEDs) to form a larger display.

Although not shown, in some embodiments every panel or tile may contain one or more control components. The control components may include one or more sensors to detect users in proximity of the panel and/or tile and provide feedback to the processor. In addition, the panel or tile may include other sensors, such as touch sensors, to allow the panel or tile to be used as a user input device in addition to merely displaying information. In this case, the panel or tile may, for example, display an alphanumeric pad using the panel or tile on a side window that contains the sparse LED array (which display may be initiated based on a proximity sensor in the panel detecting the presence of a user) and detect a combination supplied by a user to unlock a particular door(s). The panel or tile may also include one or more connectors to external digital signals, conductors and interfaces for power supply to the panel or tile, as well as other control circuitry. Integrated circuits that supply current to LEDs for one or more pixels may be included for every nth pixel. In addition, every pixel may include multiple LEDs of different colors (e.g., red, green, and blue LEDs), in addition to conductors for power and digital signals to enable delivery of a predetermined current to the LEDs.

Figure 7:
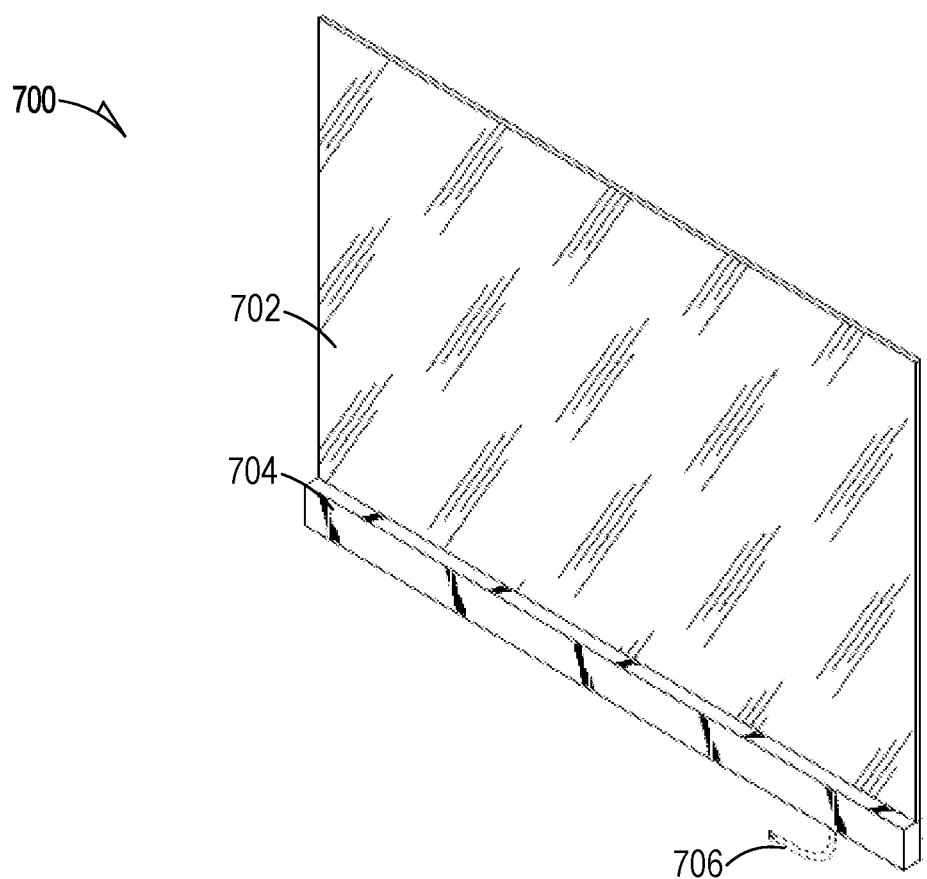
FIG. 7 illustrates an example of a panel with a single tile in accordance with various embodiments of the disclosed subject-matter.

FIG. 7 illustrates an example of a panel with a single tile in accordance with various embodiments of the disclosed subject-matter. The panel 700 may include a single tile that has a sparse LED array 702, an electronics edge 704, and a connector 706 electrically coupled to the electronics edge 704. The various components are described above. In an off mode, the panel 700 is transparent. The panel 700 may provide display on a single side or on opposite sides, as described herein.

Figure 8B:
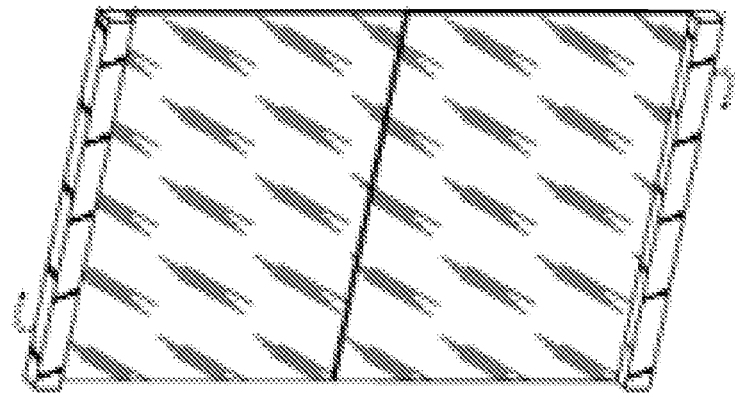
FIGS. 8A-8B illustrate an example of a panel with multiple display tiles in accordance with various embodiments of the disclosed subject-matter.
Figure 8A:
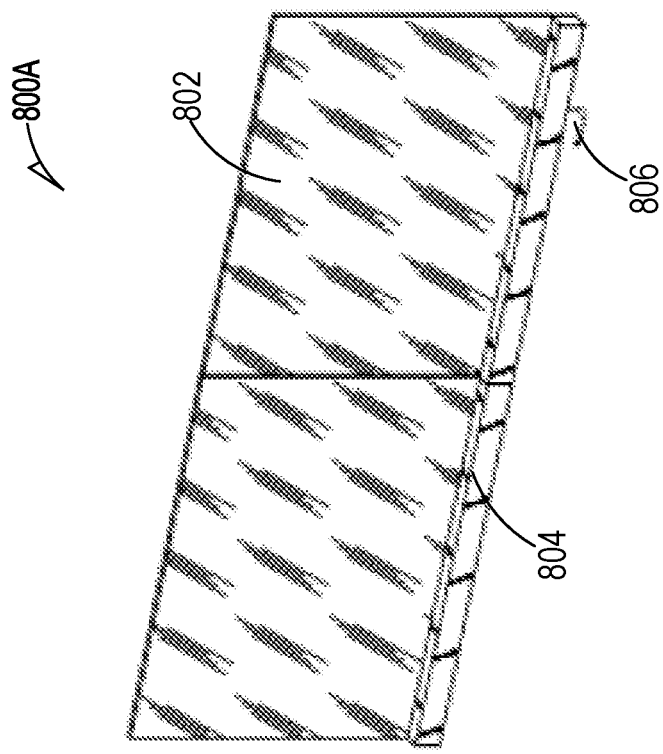

FIGS. 8A-8B illustrate an example of a panel with multiple display tiles in accordance with various embodiments of the disclosed subject-matter. Similar to FIG. 7, each tile of the panel 800a, 800b in FIGS. 8A and 8B may include a sparse LED array 802, an electronics edge 804, and a connector 806 electrically coupled to the electronics edge 804. For the rectangular tiles shown in FIGS. 8A-8B, in FIG. 8A the electronics edge 804 of the panel 800a may be disposed along a single continuous edge that forms the long edge of each tile of the panel 800a (with the short edge being common between the rectangular tiles); in FIG. 8B the electronics edge 804 of the panel 800b may be disposed along opposing edges that form the short edges of each tile of the panel 800b (with the long edge being common between the rectangular tiles). In an off mode, the panel 800b is transparent. The panel 800b may provide display on a single side or on opposite sides. In FIGS. 8A and 8B the tiles are the same size; in other embodiments the tiles may be different sizes, so long as the distance between pixels (that contain multiple different color LEDs) is the same.

Figure 9:
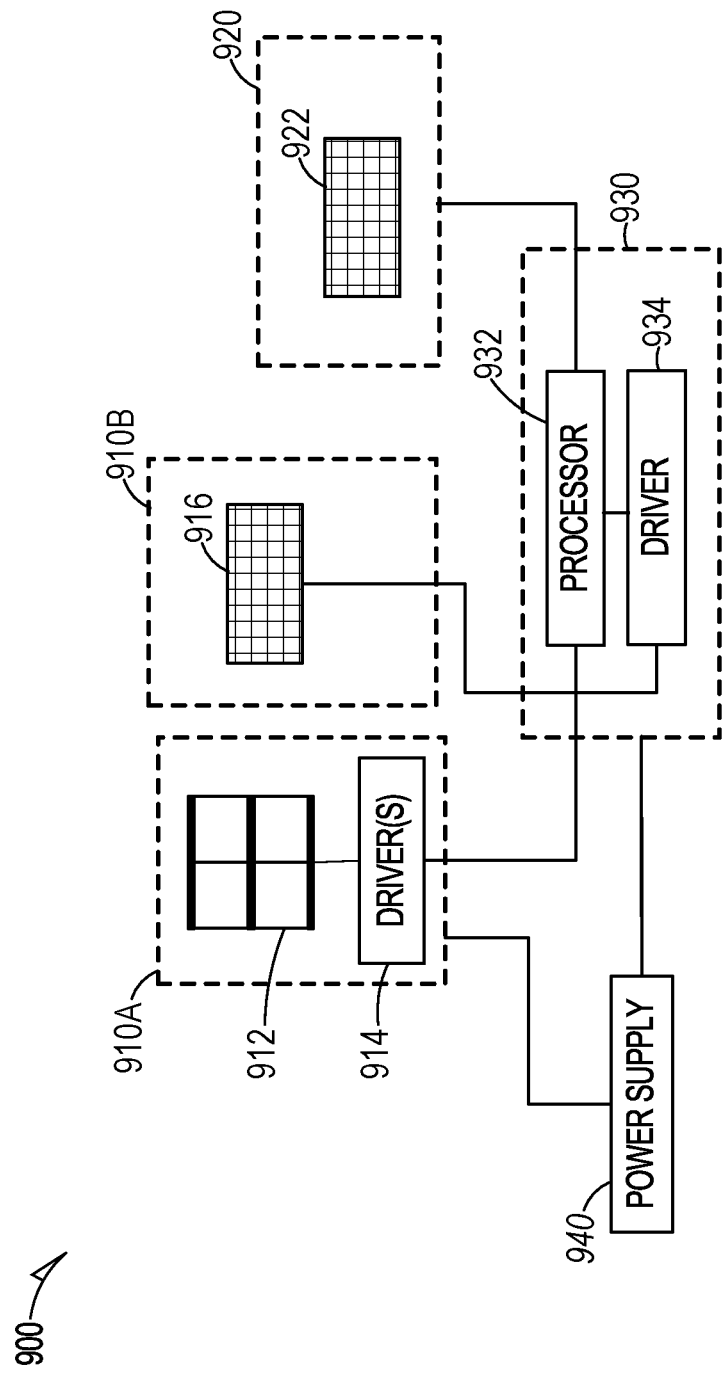
FIG. 9 shows an example of a system in accordance with various embodiments of the disclosed subject-matter.

FIG. 9 shows an example system in accordance with various embodiments of the disclosed subject-matter. In some embodiments, other components may be present, while in other embodiments not all of the components may be present. As indicated herein, although the term "a" is used herein, one or more of the associated elements may be used in different embodiments. For example, the term "a processor" configured to carry out specific operations includes both a single processor configured to carry out all of the operations as well as multiple processors individually configured to carry out some or all of the operations (which may overlap) such that the combination of processors carry out all of the operations.

The system 900 may include one or more light sources 910a, 910b. A first light source 910a may include one or more of the sparse LED arrays 912 as described herein. The first light source 910a may include local drivers 914, as also described herein. The first light source 910a may be disposed in various locations on or within an apparatus, as described in more detail herein. A second light source 910b may be present and may include one or more non-sparse LED arrays 916 (e.g., microLED arrays, miniLEDs arrays, or other). The second light source 910b may be disposed in various other locations on or within an apparatus containing the system 900.

The LEDs in the first light source 910a and/or second light source 910b may contain microLEDs. A microLED array contains thousands to millions of microscopic microLEDs that emit light and that may be individually controlled or controlled in groups of pixels (e.g., 5×5 groups of pixels). The microLEDs are small (e.g., <0.07 mm on a side) and may provide monochromatic or multi-chromatic light, typically red, green, blue, or yellow using inorganic semiconductor material such as that indicated above. Other LEDs may have a size, for example, of about 4 mm$^2$, 250 micron×250 micron, or larger. MicroLEDs may be used, for example, due to their thickness about a 5 μm thickness or so, similar to thin film LEDs, and, as there is no substrate inherent to microLEDs, microLEDs may be able to be placed directly on a backplane. This results in a light source that has an overall thickness that is substantially less than that using other LEDs. The individual control provided by the microLEDs allows the driving electronics for displays to use either an active matrix array of driving transistors or a full driver microICs individual intensity control. The use of microICs may be used to bring a substantial amount of fine control to each LED operation.

A controller 930 may include a processor 932, which may be used to control various functions of the system 900. As also shown, the controller 930 may contain further components, such as a driver 934 configured to drive, among others, the second light source 910b as controlled by the processor 932. In some embodiments, the driver 934 may also be configured to provide non-local driving of the sparse LED arrays 912 of the first light source 910a.

As above, LEDs of the sparse LED arrays 912 and non-sparse LED arrays 916 may be formed from one or more inorganic materials (e.g., binary compounds such as gallium arsenide (GaAs), ternary compounds such as aluminum gallium arsenide (AlGaAs), quaternary compounds such as indium gallium phosphide (InGaAsP), gallium nitride (GaN), or other suitable materials), usually either III-V materials (defined by columns of the Periodic Table) or II-VI materials. The LEDs in the different arrays may emit light in the visible spectrum (about 400 nm to about 800 nm) and/or may emit light in the infrared spectrum (above about 800 nm). At least some of the LEDs may be formed by combining n- and p-type semiconductors on a rigid substrate (which may be textured), for example, of sapphire aluminum oxide (Al2O3) or silicon carbide (SiC), among others. In particular, various layers are deposited and processed on the substrate during fabrication of the LEDs. The surface of the substrate may be pretreated to anneal, etch, polish, etc. the surface prior to deposition of the various layers. The original substrate may be removed and replaced by a thin transparent rigid substrate, such as glass, or a flexible substrate, for example plastic.

In general, the various LED layers may be fabricated using epitaxial semiconductor deposition (e.g., by metal organic chemical vapor deposition) to deposit one or more semiconductor layers, metal deposition (e.g., by sputtering), oxide growth, as well as etching, liftoff, and cleaning, among other operations. The substrate may be removed from the LED structure after fabrication and after connection to contacts on a backplane via metal bonding such as via wire or ball bonding. The backplane may be a printed circuit board or wafer containing integrated circuits (ICs), such as a CMOS IC wafer or from a transparent material such as glass, PET, polyamideimide, polyetherimide, or clear polyimide. The semiconductor deposition operations may be used to create an LED with an active region in which electron-hole recombination occurs and the light from the LED is generated. The active region may be, for example, one or more quantum wells. Metal contacts may be used to drive provide current to the n- and p-type semiconductors from the ICs (such as drivers) of the backplane on which the LED is disposed. Methods of depositing materials, layers, and thin films may include, for example: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof, among others.

In some embodiments, one or more other layers, such as a phosphor-converting layer that contains phosphor particles, may be disposed on some or all of the LEDs or some or all of the LED arrays 912, 916 to convert at least a portion of the light from the LEDs to light of a different wavelength. For example, blue light from GaN LEDs may be converted into near infrared light or white light by the phosphor-converting layer.

The light sources 910a, 910b may include at least one lens and/or other optical elements such as reflectors. In different embodiments, a single lens may be disposed over one or more of the LED arrays 912, 916, multiple lenses may be disposed over one or more of the LED arrays 912, 916 with a single lens disposed over one or more of the LED arrays 912, 916, or multiple lenses may be disposed over one or more of the LED arrays 912, 916 with a single lens disposed over one or more of the LEDs of each of the LED arrays 912, 916. The at least one lens and/or other optical elements may direct the light emitted by the one or more of the LED arrays 912, 916 toward a target.

The processor 932 may also control a sensor 920 that includes a multi-pixel detector 922. The sensor 920 may sense light at the wavelength or wavelengths emitted by the second LED array 916 and reflected by a target and/or radiation that is emitted by the target. The sensor 920 may, for example, be a radar or lidar sensor, or the processor 932 may be used to determine the presence of specific objects (e.g., other vehicles, people, road signs) nearby. The sensor 920 may include optical elements (e.g., at least one sensor lens) to capture the radiation. The multi-pixel detector 922 may include, for example, photodiodes or one or more other detectors capable of detecting light in the wavelength range (s) of interest.

The multi-pixel detector 922 may include multiple different arrays to sense visible and/or infrared light. The multi-pixel detector 922 may have one or more segments (that are able to sense the same wavelength/range of wavelengths or different wavelength/range of wavelengths), similar to the LED 916.

In some embodiments, instead of, or in addition to, being provided in the sensor 920, a multi-pixel detector may be provided in the second light source 910b. In some embodiments, the second light source 910b and the sensor 920 may be integrated in a single module, while in other embodiments, the second light source 910b and the sensor 920 may be separate modules that are disposed on a printed circuit board (PCB) or other mount. In other embodiments, the second light source 910b and the sensor 920 may be attached to different PCBs or mounts.

The LEDs in each of the LED arrays 912, 916 may be driven in an analog or digital manner, i.e., using a direct current (DC) driver or pulse width modulation (PWM). As shown, drivers 914, 934 may be used to respectively drive the LEDs in the LED array 912, 916, as well as other components, such as the actuators.

The components of the system 900 shown in FIG. 9 may be provided power using a power supply 940, such as a battery.

The first light source 910a may be arranged to emit light in sparse distribution such that the LEDs occupy a small areal density so as to enable visual observation of information provided by the first light source 910a while permitting viewing through the underlying transparent (flexible) substrate of the regions between the LEDs along a line of sight that passes through the regions between the LEDs. This may allow an observer on the emitting side of the first light source 910a to view the information projected by first light source 910a as well as the underlying scene. In other embodiments in which the underlying substrate is fully reflective to visible light or specularly reflective, the regions between the LEDs may not be viewable.

The information projected by first light source 910a may be static or moving, similar to that able to be formed from a non-sparse light source. The LEDs of the first light source 910a may be electrically connected using conductive traces on the substrate that are configured to provide drive current to the LEDs from the drivers 914. As above, the conductive traces may be transparent and include one or more layers of TCO. The conductive traces, even if formed from a non-transparent metal, may be relatively narrow and spaced sufficiently far apart to permit visual observation through the substrate without substantial interference. The conductive traces may, for example, be less than about 100 µm wide. The LEDs may be connected in series or parallel via the conductive traces along each of a row and column to the edge or edges containing the control circuitry (and power supply) and may be addressed individually or in groups of LEDs. The drivers 914 and other control devices in the first light source 910a for each pixel may also be referred to as a microIC.

The first light source 910a can be mounted on or in, or attached to, any portion of an apparatus or within any commercial environment, as described in more detail below.

Figure 10:
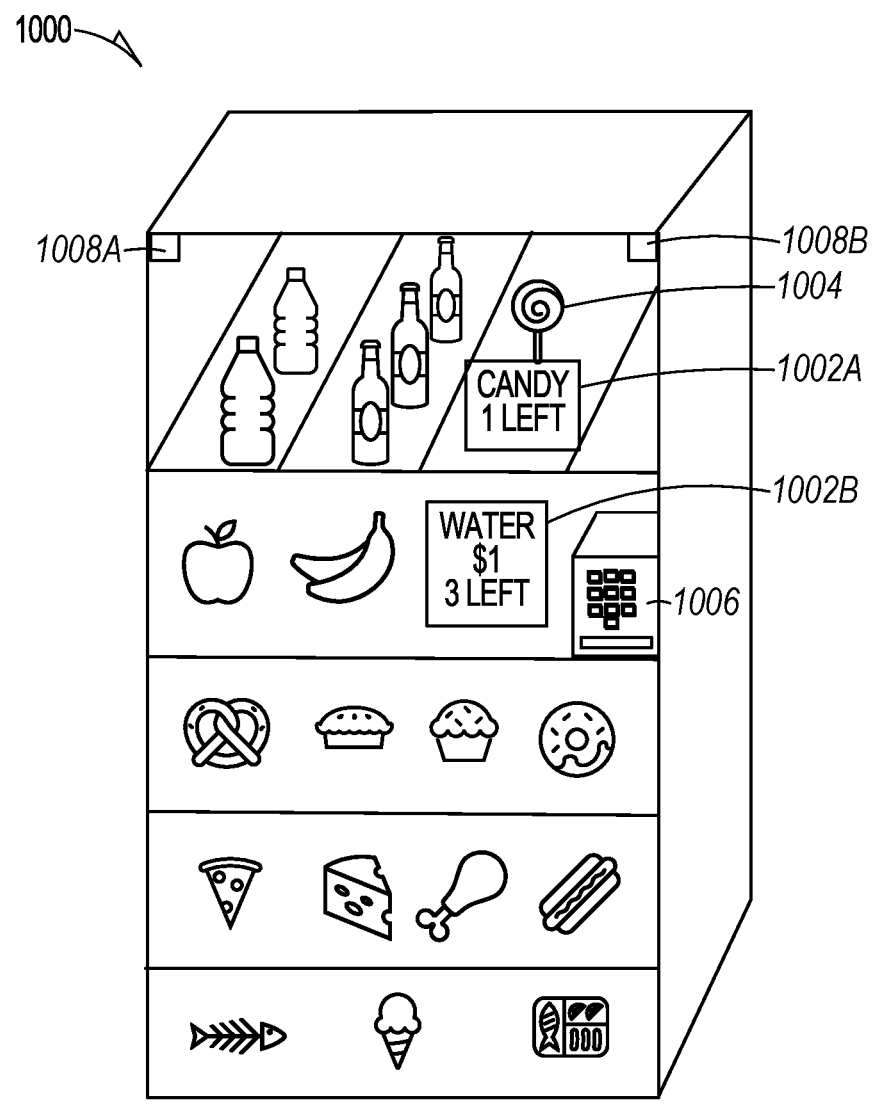
FIG. 10 shows an example of an apparatus using sparse array arrangement of LEDs in accordance with various embodiments of the disclosed subject-matter.

FIG. 10 shows an example apparatus using a sparse array arrangement in accordance with various embodiments of the disclosed subject-matter. For example, the apparatus may be a vending machine 1000 that contains products 1004 such as food or other goods that are viewable through the transparent front surface (formed, for example, from glass, plexiglass, or another transparent material). The vending machine 1000 may have multiple panels 1002a, 1002b with sparse LED arrays. Each of the panels 1002a, 1002b may have one or more tiles, as described above. Each panel 1002a, 1002b (or tile) may be disposed at a location of the surface associated with a different product 1004. The panels 1002a, 1002b may be disposed on or within the transparent material forming a surface (e.g., the front or sides) of the vending machine 1000. The panels 1002a, 1002b may be controlled by a processor within a control center 1006 of the vending machine 1000.

The use of panels 1002a, 1002b that contain the sparse LED arrays permits the products 1004 to be visible to an observer while providing information that may be useful in making a purchase. Such information may include, but is not limited to, the identity of the product, the quantity of the product available, the cost of the product, among others. This information may simplify mechanisms within as well as user interactions with the vending machine 1000 by, for example, providing such information without the user manually counting the objects or undertaking further interactions with the vending machine 1000 to determine the cost of the product. Because of the transparency of the sparse LED arrays, the information may be presented over a large area while not impeding viewing of the products 1004.

The information provided by the panels 1002a, 1002b may be textual and/or graphic such that the content provided is alphanumeric, symbolic, or image content. The information may be displayed constantly or may only be displayed under certain conditions. The conditions may be based on timing (e.g., 6 am-9 pm) or sensor input. For example, one or more sensors/receivers 1008a, 1008b may be disposed at various locations within the vending machine 1000. The sensors 1008a, 1008b may be proximity sensors that detect the presence of an individual within a predetermined distance (such as within about a meter or fractions of a meter) from the front of the vending machine 1000. In addition, or instead, the sensors 1008a, 1008b may track eye movement and viewing direction of an individual viewing the products 1004 and, in response to detection of the individual viewing the product for a predetermined amount of time (e.g., 3 or more seconds), a processor in the control center 1006 may activate the appropriate panel. The eye movement may be tracked using technology similar to that used for augmented reality/virtual reality headsets.

The sensors 1008a, 1008b may emit visible or infrared light. The emitted light from may be reflected, the reflection may be captured, and the processor determine the proximity and/or eye location. Alternatively, the sensors 1008a, 1008b may include a camera that may capture images, which may then be analyzed by the processor to determine the proximity and/or eye location.

In other embodiments, the sensors 1008a, 1008b may additionally or instead be disposed in each panel 1002a, 1002b. Similarly, a touch sensor (touch sensitive inputs) or another display for user inputs (e.g., a projected alphanumeric pad) may be provided in or adjacent to each panel 1002a, 1002b, with the panel 1002a, 1002b able to detect user interactions with the inputs for selection of an associated product 1004 (payment may still be made using the control center 1006). The processor that controls the panel 1002a, 1002b may adjust the information provided by the panel 1002a, 1002b based on the user input received by the touch sensor. In some embodiments, proximity sensors may be disposed in some locations within the vending machine 1000 and eye location detection sensors may be disposed in other locations within the vending machine 1000. The eye location detection sensors or position sensors may include infrared emitters or regular cameras in the vending machine 1000 that are used by the processor to detect the position of the individual and/or eye position. The processor may then use this information to reposition the image dependent on the detected viewer position to adjust the angle of emission using adjustment of optical elements in the panels 1002a, 1002b or mechanically adjust a position of the panels 1002a, 1002b.

In general, each pixel in each panel 1002a, 1002b may emit light in a direction substantially symmetric around a normal direction that is normal to the underlying portion on which the pixel is disposed. In some embodiments, the light from each pixel may radiate in a Lambertian pattern, for example. However, propagation of the light in the normal direction may result in a diminished viewing capacity for individuals not within the main lobe of the Lambertian pattern as a significant portion of the light is directed towards a direction that is not viewable. To this end, in some embodiments, one or more optical elements in the sparse LED array may be used to adjust the emission angle to an optimized direction in which the (Lambertian) pattern of the emitted light centers around a primary non-normal viewing angle for a viewing position based on the detected individual location and perhaps eye tracking information.

Other information may be provided, e.g., to direct a user to a nearby machine that contains a particular product in which the user is interested when it is determined that the particular product in the vending machine 1000 is sold out. The vending machine 1000 may thus be in communication with the nearby machine to determine the products contained in the nearby machine.

Alternatively, or in addition, to providing information related to the products 1004, the panels 1002a, 1002b may be used to display or project other information. For example, one or more of the panels 1002a, 1002b may display ads or other visual information. The one or more of the panels 1002a, 1002b may be selected by the processor to be near (e.g., adjacent to) the product 1004 with which the user is interacting.

A similar system may be provided for display cases in commercial stores. Similar to the above, the panels may be disposed on or within the transparent material forming the front of a display case (in addition to the use of the sensors). For example, the panels can be used at various locations on a refrigerated case containing drinks to provide similar information as that described above. In addition, if a particular product is detected by the system to be out of stock, the system may notify the store and/or supplier that a restock of the product is to be performed either through SMS or other wireless communication and/or by displaying the out of stock information using the panel (with alternate driving of the LEDs, such as flashing or in a unique color).

Figure 11:
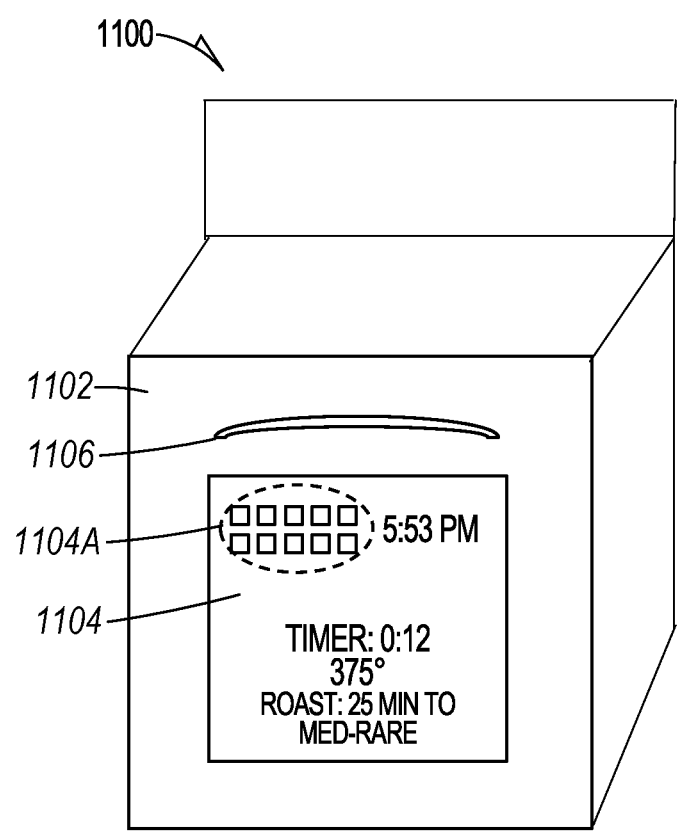
FIG. 11 shows an example of a panel application in accordance with various embodiments of the disclosed subject-matter.

Similar technology may be used for appliances. FIG. 11 shows an example panel application in accordance with various embodiments of the disclosed subject-matter. The appliance shown may be an oven 1100. The oven 1100 may have a front 1102 a transparent area on or within which one or more panels 1104 may be disposed; and a handle 1106 to open and close the oven 1100. The panels 1104 may have an input area 1104a with alphanumeric touch sensitive sensors, as well as one or more other areas configured to display information about the current oven operation. The additional information may include current time (as shown 5:53 PM), time left (as shown 12 minutes) in a timer set by the user using the input area 1104a, current oven temperature (as shown 375° F.), and information about the food being cooked (as shown 12 minutes). Other oven operational information may also be displayed on the panels 1104, such as a warning that cleaning of the oven is to be undertaken. As above, the oven 1100 may have a wireless connection to alert the user to useful information (e.g., timer information) via text or other electronic communication. This may be set via user entry into the input area 1104a or via remote input (e.g., via a mobile device). As above, the use of a sparse LED array in the panel 1104 may permit the information to be provided by the panel 1104 to the user while simultaneously retaining the ability for the user to see through the transparent area to the area inside the oven 1100.

In other embodiments, similar uses may be applied for any appliance in which a transparent area is present. For example, microwave or toaster ovens, washers and dryers, and even refrigerators or dishwashers may have one or more panels disposed on the transparent area and provide information germane to the appliance. In addition, the appliance may have a wireless connection to alert the user to useful information via text or other electronic communication, such as time to end of the particular cycle/timer, or an issue with the appliance.

Figure 12:
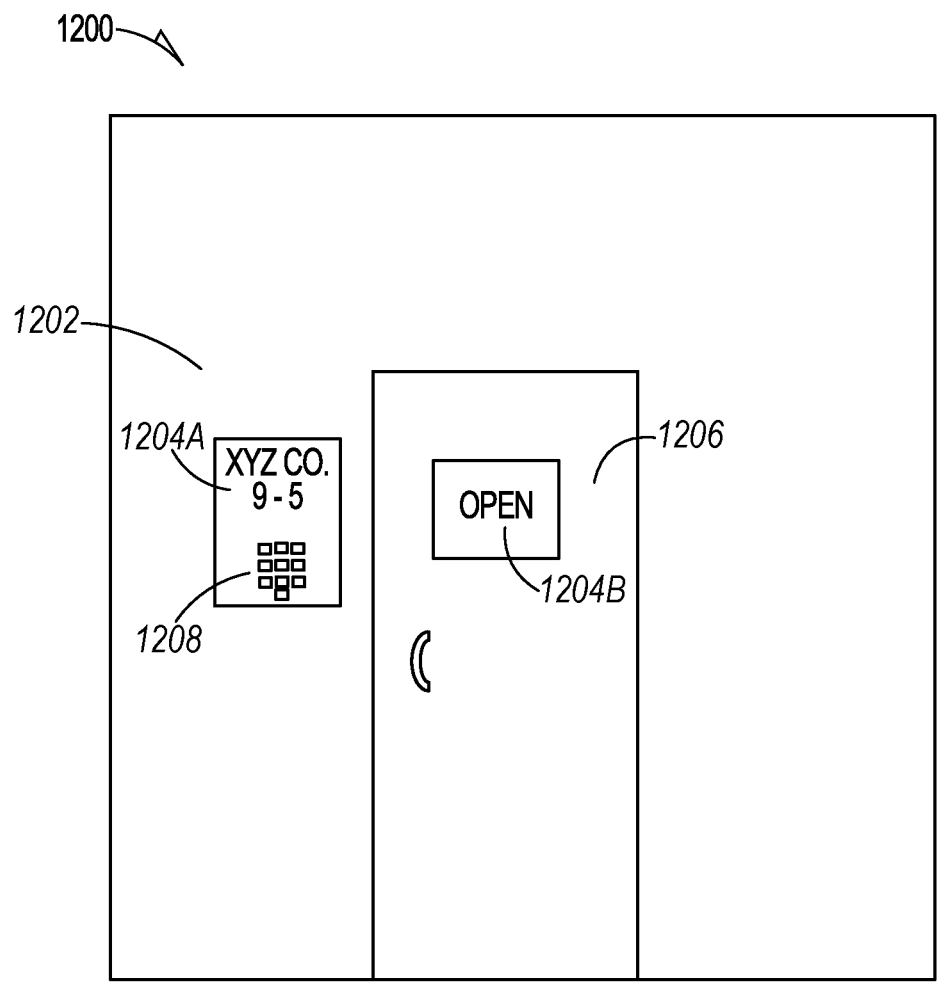
FIG. 12 shows another example of a panel application in accordance with various embodiments of the disclosed subject-matter.

FIG. 12 shows another example panel application in accordance with various embodiments of the disclosed subject-matter. As shown in FIG. 12, a building 1200 may have one or more panels 1204a, 1204b located on or within one or more transparent areas of a wall 1202 and/or door 1206 of the building 1200. To avoid potential malicious damage, the panels 1204a, 1204b may be located on the inner wall 1202 and/or door 1206 of the building 1200 so that building staff, if present, may control access to the panels 1204a, 1204b. As above, each panel 1204a, 1204b may be disposed on or in the transparent area. Unlike the examples provided in FIGS. 10-11, at least some of the panels 1204a, 1204b of FIG. 12 may be dual-sided, and thus be able to provide information projecting from opposite sides of the transparent area. This dual-sided display is described in more detail below. The panels 1204a, 1204b of FIG. 12 that are not dual-sided may emit towards only one side of the transparent area in which the panels 1204a, 1204b are located.

As above, the use of a sparse LED array in some or all of the panels 1204a, 1204b may permit the information to be provided by the panels 1204a, 1204b to a user while simultaneously retaining the ability for the user to see through the transparent area to the area on the other side of the transparent area.

The panels 1204a, 1204b in FIG. 12 may be of any size. Thus, a building 1200 having multiple areas (e.g., the wall 1202 and/or door 1206) formed from glass, for example, may have extensive areas in which panels 1204a, 1204b are provided, allowing for a variety of different information to be provided to both internal and external individuals. For example, one or more panels 1204a on the wall 1202 may indicate to external viewers (outside the building 1200) companies and hours of occupation within the building 1200; one or more panels 1204b on the door 1206 may indicate to external viewers that the building 1200 is open, among other information. Similarly, the panels 1204a, 1204b may provide different information to internal viewers (inside the building 1200), such as information related to the weather (e.g., temperature, humidity) or traffic conditions. Other information may be provided, such as advertisements of goods or services, such as that available within the building 1200.

Similar to the other embodiments, proximity and/or touch sensors 1208 may be incorporated in, or operate in conjunction with (e.g., adjacent to), the panels 1204a, 1204b in FIG. 12. The touch sensor may be used by an individual to affect operations of building 1200, for example to change the information displayed, alert a permanent occupant of the building 1200 of the presence of the individual, and/or gain entry to the building 1200 (e.g., using a code to unlock the door 1206) among others. As above, timers and/or proximity sensors may be used to conserve power for the building 1200, and user input sensors may be provided to allow a user to determine information, for example, regarding companies, floors, hours, etc. within the building 1200.

Figure 13B:
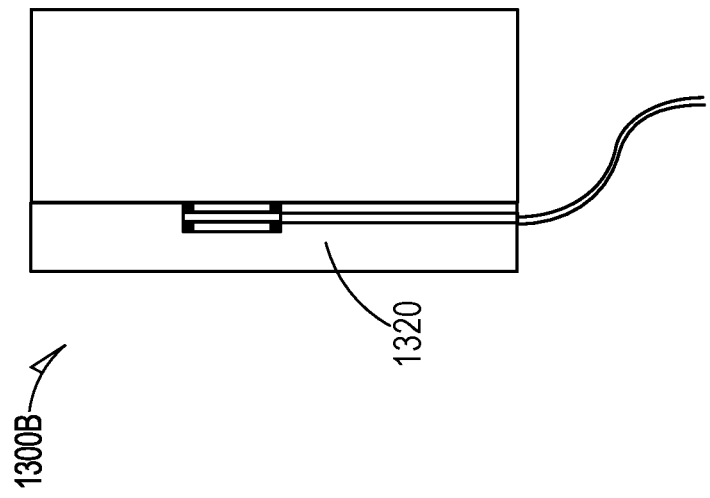
FIGS. 13A and 13B show examples of a sparse LED array arrangement in accordance with various embodiments of the disclosed subject-matter.
Figure 13A:
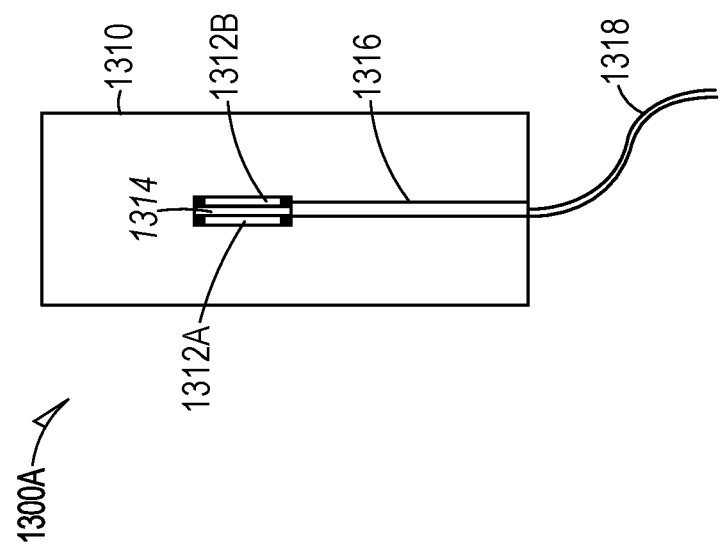

FIGS. 13A and 13B show examples of a sparse LED array arrangement in accordance with various embodiments of the disclosed subject-matter. As described herein, the dual-sided panel 1300a, 1300b may contain a panel 1314 that contains multiple sparse LED arrays 1312a, 1312b disposed back-to-back. The individual (or sets of pixels) of the sparse LED arrays 1312a, 1312b. Each of the sparse LED arrays 1312a, 1312b may be disposed on a non-transparent substrate, thereby limiting viewing of the information projected to only one hemisphere. A connection 1318, such as a cable or wiring, may provide power and enable control by a processor of the panel 1314 via traces 1316 connected to electronics of the panel 1314 that control the sparse LED arrays 1312a, 1312b. As shown in FIG. 13A, the panel 1314 may be disposed within a cavity formed by the transparent material 1310. An end of the power connection 1318 may be retained within the transparent material 1310 to provide a robust electrical connection with the traces 1316. As shown in FIG. 13B, the panel 1314 may instead be disposed on the transparent material 1310 and protected by a protective layer 1320, such as PET. The use of a dual-sided sparse LED array arrangement as described in FIGS. 13A and 13B may permit different information to be displayed to observers on opposite sides of the transparent material 1310 without limiting viewing through the transparent material 1310 in either direction. For example, as shown in FIG. 12 observers within the building 1200 and outside of the building 1200 may simultaneously be provided with different information without the different information being visible to observers on the opposite side of the transparent area and while being able to see through the transparent area.

Figure 14:
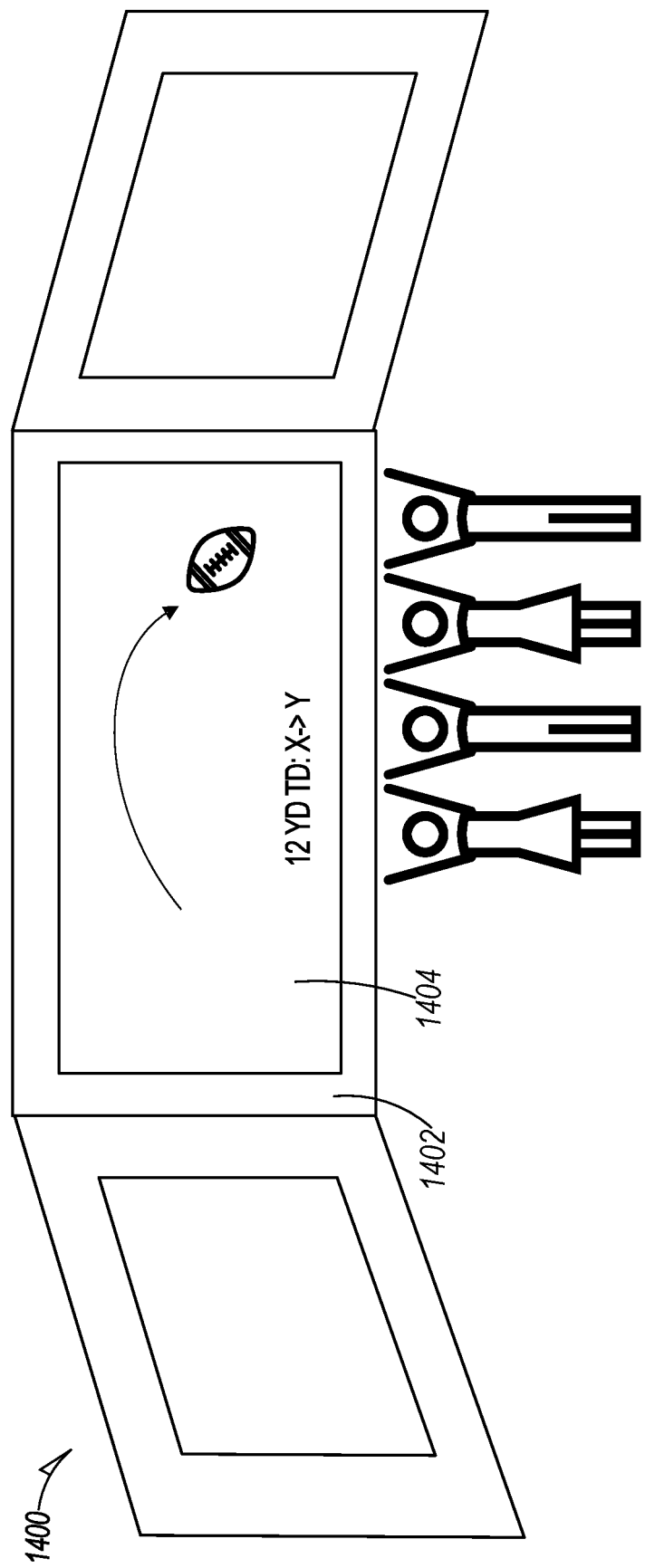
FIG. 14 shows another example of a sparse LED array arrangement in accordance with various embodiments of the disclosed subject-matter.

FIG. 14 shows another example of a sparse LED array arrangement in accordance with various embodiments of the disclosed subject-matter. The room 1400 may be, for example, a skybox or other area in an arena that provides sporting or other events. The room 1400 may have one or more windows 1402, each of which may contain one or more panels 1404. The panels 1404 may be single-sided or dual-sided, e.g., providing advertisements to viewers outside the room 1400 and other information to viewers inside the room 1400. For example, one or more of the panels 1404 may be activated to replay an action on the field (such as a football pass shown in FIG. 14), perhaps with highlighting of specific features (e.g., the arc of the football), along with information about statistics, such as the yardage (shown as a 12-yard gain) and pass recipient. Such a display may provide a controllable replay of the play on an overlay of the actual field. In addition, the panels 1404 may be activated during a play to highlight actions of the play or provide similar information as above during the play. Cameras in the windows 1402 may be used to capture images of the on field action, which may be processed by one or more processors and then adjusted by the processors to control display by the panels 1404. As above, the panels 1404 may contain touch sensitive sensors across some or all of the entire field of display.

Similar embodiments may be used for any event in an arena or an outdoor venue. For example, one or more sections of a hockey rink may have similar panels embedded in the plexiglass surrounding the ice to permit a replay of a pass, goal, or blocked shot. As before, as the individual pixels or sets of pixels of the panels 1404 may be individually controllable, some of the information provided by a panel may be entirely different from the replay, for example, providing advertisements.

Similar embodiments may be used within or on the windows of a private residence (e.g., a house or apartment) or commercial residence (e.g., hotel room). The display may provide alphanumeric information such as temperature, weather, family/personal schedules, or images such as from a camera (e.g., home security, doorbell, bird feeder, shed, etc.).

Figure 15:
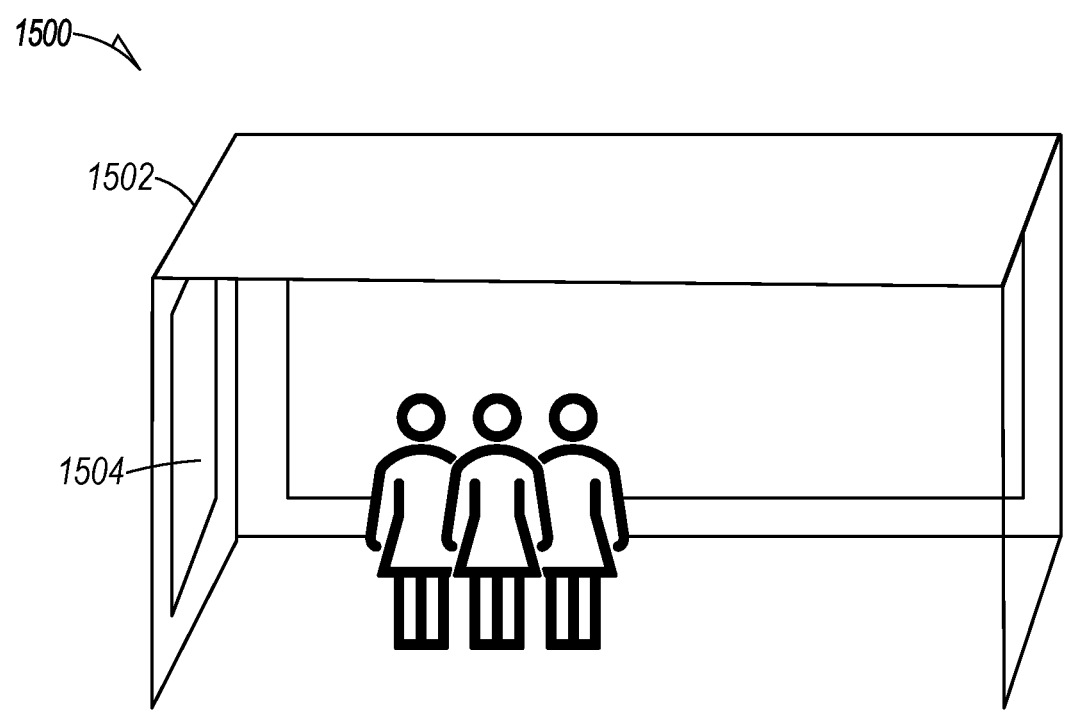
FIG. 15 shows another example of a sparse LED array arrangement in accordance with various embodiments of the disclosed subject-matter.

Other embodiments that contain panels may include enclosures having transparent areas. FIG. 15 shows another example of a sparse LED array arrangement in accordance with various embodiments of the disclosed subject-matter. FIG. 15 shows an example enclosure, such as a bus stop shelter 1500 having one or more transparent sides 1502 in which one or more panels 1504 may be incorporated. Information such as bus schedules of buses arriving at and departing from the bus stop shelter 1500, time to the next bus of each bus, and other travel, weather, and/or pertinent travel-related information may be displayed on one or more of the panels 1504. Such travel-related information may include, for example, information about places of interest, bus routes to get to the places of interest, number of stops to reach the places of interest, and predicted arrival time to the places of interest. In some embodiments, panels 1504 may be incorporated on the roof of the shelter 1500 if transparent. For safety reasons, a shelter such as the bus stop shelter 1500 may be entirely or substantially entirely transparent. As above, proximity and/or touch sensors may be incorporated in, or operate in conjunction with (e.g., adjacent to), the panels 1504. Also, timers and/or the proximity sensors may be used to conserve power for the bus stop shelter 1500.

Similar features may be incorporated in other types of shelters, e.g., for vehicles such as taxis or private vehicle services.

In the various embodiments presented, the use of a sparse LED array (in some cases using microLEDs) permits display of various types of alphanumeric and image information while permitting visibility through the transparent material in or on which the sparse LED array is incorporated. Such arrays may be used in any embodiments in which such functionality is desired and thus are not limited to the examples provided herein. The incorporation of the various types of sensors and detectors may allow for user input and sensing to provide an even wider functionality, such as use of panels in a museum (or commercial) display case in which an encased artwork, for example, to provide information about the artwork and perhaps permit interaction with the information while still permitting observers to view the artwork. Similar embodiments may be used for applications such as zoo enclosures (or commercial animal disclosures) to provide text and imagery related to the animals behind the glass (or otherwise within an enclosure) such as animal history, habitat, which may be preset or based on user input, as well as provide directions to other animals.

Figure 16:
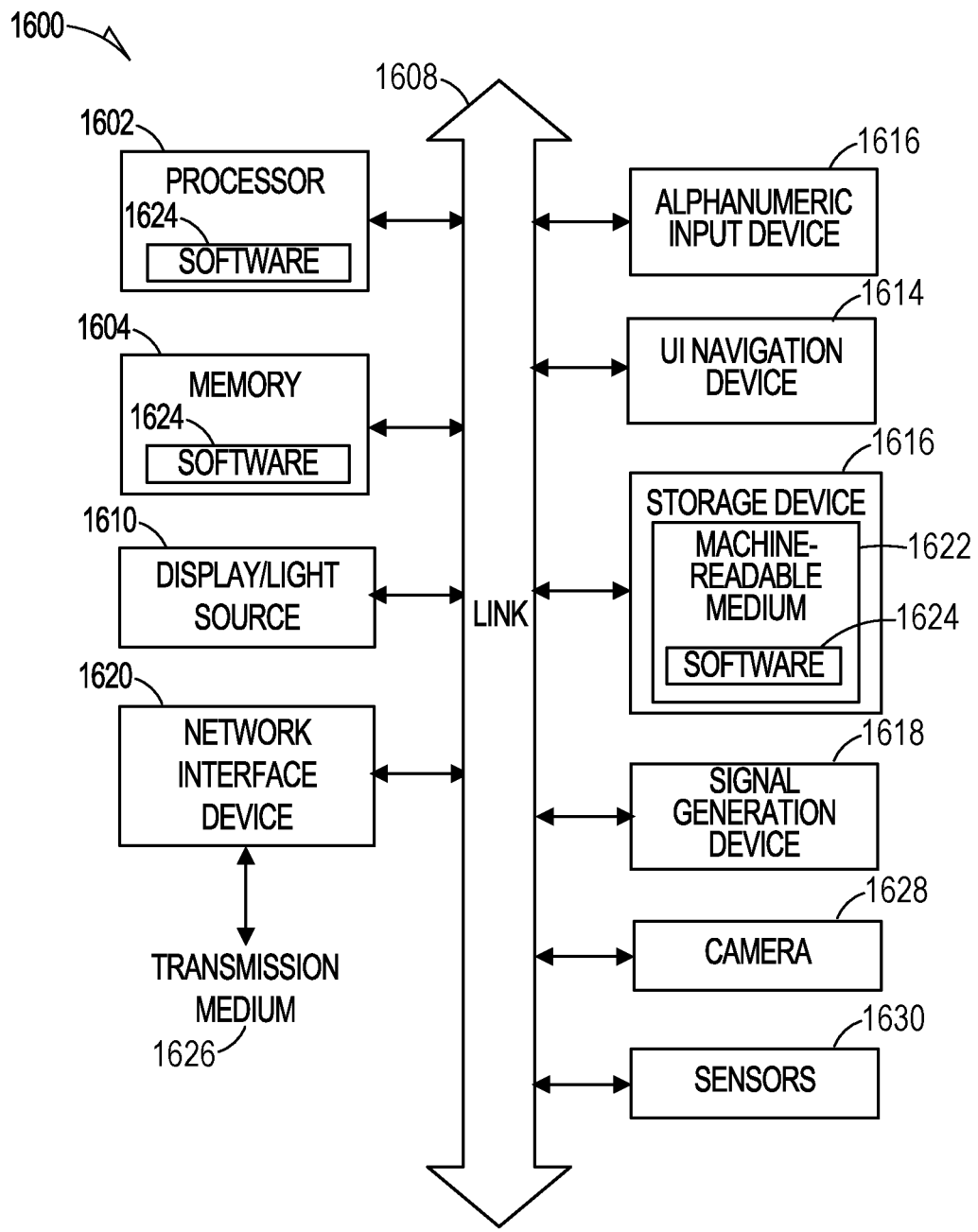
FIG. 16 illustrates an example of a general device in accordance with some embodiments.

FIG. 16 illustrates an example of a general device 1600 in accordance with some embodiments. The device 1600 may be a vehicle-embedded display for example. Various elements may be provided on a backplane indicated above, while other elements may be local or remote. Examples, as described herein, may include, or may operate on, logic or a number of components, modules, or mechanisms.

Modules and components are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" (and "component") is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The electronic device 1600 may include a hardware processor (or equivalently processing circuitry) 1602 (e.g., a central processing unit (CPU), a GPU, a hardware processor core, or any combination thereof), a memory 1604 (which may include main and static memory), some or all of which may communicate with each other via an interlink (e.g., bus) 1608. The memory 1604 may contain any or all of removable storage and non-removable storage, volatile memory or non-volatile memory. The electronic device 1600 may further include a display/light source 1610 such as the LEDs described above, or a video display, an alphanumeric input device 1612 (e.g., a keyboard), and a user interface (UI) navigation device 1614 (e.g., a mouse). In an example, the display/light source 1610, input device 1612 and UI navigation device 1614 may be a touch screen display. The electronic device 1600 may additionally include a storage device (e.g., drive unit) 1616, a signal generation device 1618 (e.g., a speaker), a network interface device 1620, one or more cameras 1628, and one or more sensors 1630, such as a global positioning system (GPS) sensor, compass, accelerometer, or other sensor such as those described herein. The electronic device 1600 may further include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). Some of the elements, such as one or more of the sparse arrays that provide the display/ light source 1610 may be remote from other elements and may be controlled by the hardware processor 1602.

The storage device 1616 may include a non-transitory machine readable medium 1622 (hereinafter simply referred to as machine readable medium) on which is stored one or more sets of data structures or instructions 1624 (e.g., software) embodying or utilized by any one or more of the techniques or functions described herein. The instructions 1624 may also reside, completely or at least partially, within the memory 1604 and/or within the hardware processor 1602 during execution thereof by the electronic device 1600. While the machine readable medium 1622 is illustrated as a single medium, the term "machine readable medium" may include a single medium or multiple media (e.g., a centralized or distributed database, and/or associated caches and servers) configured to store the one or more instructions 1624.

The term "machine readable medium" may include any medium that is capable of storing, encoding, or carrying instructions for execution by the electronic device 1600 and that cause the electronic device 1600 to perform any one or more of the techniques of the present disclosure, or that is capable of storing, encoding or carrying data structures used by or associated with such instructions. Non-limiting machine-readable medium examples may include solid-state memories, and optical and magnetic media. Specific examples of machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks.

The instructions 1624 may further be transmitted or received over a communications network using a transmission medium 1626 via the network interface device 1620 utilizing any one of a number of wireless local area network (WLAN) transfer protocols or a SPI or CAN bus. Example communication networks may include a local area network (LAN), a wide area network (WAN), a packet data network (e.g., the Internet), mobile telephone networks (e.g., cellular networks), Plain Old Telephone (POTS) networks, and wireless data networks. Communications over the networks may include one or more different protocols, such as Institute of Electrical and Electronics Engineers (IEEE) 802.11 family of standards known as Wi-Fi, IEEE 802.16 family of standards known as WiMax, IEEE 802.16.4 family of standards, a Long Term Evolution (LTE) family of standards, a Universal Mobile Telecommunications System (UMTS) family of standards, peer-to-peer (P2P) networks, a next generation (NG)/6$^{th}$ generation (6G) standards among others. In an example, the network interface device 1620 may include one or more physical jacks (e.g., Ethernet, coaxial, or phone jacks) or one or more antennas to connect to the transmission medium 1626.

Note that the term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical central processing unit (CPU), a single- or multi-core processor, and/or any other device capable of executing or otherwise operating computer-executable instructions, such as program code, software modules, and/or functional processes.

The camera 1628 may sense light at least the wavelength or wavelengths emitted by the LEDs. The camera 1628 may include optical elements (e.g., at least one camera lens) that are able to collect reflected light of illumination that is reflected from and/or emitted by an illuminated region. The camera lens may direct the reflected light onto a multi-pixel sensor (also referred to as a light sensor) to form an image of on the multi-pixel sensor.

The processor 1602 may control and drive the LEDs via one or more drivers. For example, the processor 1602 may optionally control one or more LEDs in LED arrays independent of another one or more LEDs in the LED arrays, so as to illuminate an area in a specified manner.

In addition, the sensors 1630 may be incorporated in the camera 1628 and/or the light source 1610. The sensors 1630 may sense visible and/or infrared light and may further sense the ambient light and/or variations/flicker in the ambient light in addition to reception of the reflected light from the LEDs. The sensors may have one or more segments (that are able to sense the same wavelength/range of wavelengths or different wavelength/range of wavelengths), similar to the LED arrays.

Figure 18:
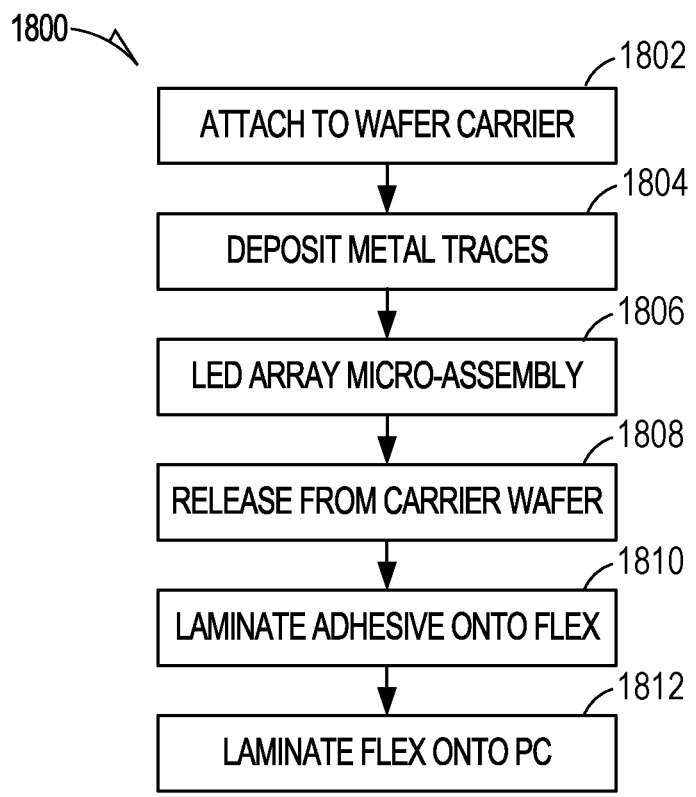
FIG. 18 illustrates an example of a method of fabricating the sparse array in accordance with the process operations shown in FIGS. 17A-17G.

FIGS. 17A-17G illustrate an example of a process 1700 of fabricating the sparse array in accordance with some embodiments. FIG. 18 illustrates an example of a method 1800 of fabricating the sparse array in accordance with the process operations shown in FIGS. 17A-17G. The process starts in FIG. 17A with a transparent flexible sheet 1702. At operation 1802 in FIG. 18, the transparent flexible sheet 1702 may be attached to a carrier wafer 1704 as depicted in FIG. 17B. At operation 1804, metal traces 1706 may be deposited on the transparent flexible sheet 1702 as shown in FIG. 17C. At operation 1806, the LED array 1708 may be assembled on the metal traces 1706 as shown in FIG. 17D. At operation 1808, the transparent flexible sheet 1702 containing the metal traces 1706 and the LED array 1708 may be released from the carrier wafer 1704 as shown in FIG. 17E. At operation 1810, an adhesive layer 1710 may be laminated on the transparent flexible sheet 1702 to cover the metal traces 1706 and the LED array 1708 as shown in FIG. 17F. At operation 1812, the transparent flexible sheet 1702 may be flipped and laminated onto a printed circuit board 1712 as shown in FIG. 17G.

In other embodiments, a backplane with traces may be formed on the transparent substrate. The sparse LED array (which may contain microLEDs) may be transferred onto the transparent substrate with the backplane. The transfer may be performed, for example, using a mass transfer process to provide the sparse LED array. The mass transfer may be used to deposit the microLEDs (and microIC) mass on the transparent substrate by picking the location with stamps and tethering or anchoring the transferred material using an adhesive layer, for example. The transfer may be performed, in another example, using one or more print nozzles arrayed in parallel to provide the sparse LED array in a vacuum nozzle transfer process. The print nozzles may be an ENJET tool adapted for this process. The laminated structure may then be formed in either case. In other embodiments, after transfer, specific microLEDs may be repaired or replaced using the ENJET Tool.

Alternatively, traces may be formed on the transparent substrate. The LEDs may then be formed on the transparent substrate and the laminated structure formed as above.

Thus, the various embodiments described herein may be used in a wide variety of commercial, residential, and industrial environments in which transparent displays may be desired. In such environments, the transparent displays may be incorporated in or disposed on a transparent material, such as glass or plexiglass. The display may provide predetermined information, which may be determined by a processor, and/or may be manipulated by a user through a user input incorporated in or near the transparent display.

EXAMPLES

Example 1 is a sparse display, comprising: at least one tile configured to display information, the at least one tile disposed at at least one location of within or on an indoor transparent material, each of the at least one tile including: a transparent flexible substrate; a sparse array of light-emitting diodes (microLEDs) disposed on the transparent flexible substrate, a distance between microLEDs of the sparse array configured to display at least one of alphanumeric and image information while providing visibility through the transparent material; a transparent rigid substrate adhered to the transparent flexible substrate via an adhesive layer in which the sparse array of microLEDs is encapsulated; and at least one driver disposed on an edge of the tile and configured to drive the microLEDs of the tile.

In Example 2, the subject matter of Example 1 includes, wherein a surface of a vending machine includes the transparent material, and the information is related to products within the vending machine.

In Example 3, the subject matter of Example 2 includes, wherein the at least one tile includes one or more tiles disposed at a location of the surface associated with a different product, and the information provided by the one or more tiles is related to an associated product associated with the one or more tiles.

In Example 4, the subject matter of Example 3 includes, wherein at least one of the one or more tiles comprises a touch sensor configured to receive user input for selection of the associated product.

In Example 5, the subject matter of Examples 1-4 includes, wherein a window of an appliance includes the transparent material, and the information is related to operations of the appliance.

In Example 6, the subject matter of Example 5 includes, wherein the at least one tile comprises a touch sensor configured to receive user input related to the operations of the appliance.

In Example 7, the subject matter of Examples 1-6 includes, wherein the at least one tile includes a dual-sided display configured to provide different information to opposite sides of the transparent material.

In Example 8, the subject matter of Examples 1-7 includes, wherein a window of a display case includes the transparent material, and the information is related to an object within the display case.

In Example 9, the subject matter of Example 8 includes, wherein the at least one tile comprises a touch sensor configured to receive user input related to the object.

Example 10 is a sparse display, comprising: at least one tile configured to display information, the at least one tile disposed at at least one location of within or on an outdoor transparent material, each of the at least one tile including: a transparent flexible substrate; a sparse array of light-emitting diodes (microLEDs) disposed on the transparent flexible substrate, a distance between microLEDs of the sparse array configured to display at least one of alphanumeric and image information while providing visibility through the transparent material; a transparent rigid substrate adhered to the transparent flexible substrate via an adhesive layer in which the sparse array of microLEDs is encapsulated; and at least one driver disposed on an edge of the tile and configured to drive the microLEDs of the tile.

In Example 11, the subject matter of Example 10 includes, wherein at least one of a window and a door of a building includes the transparent material, and the information is related to operations of the building.

In Example 12, the subject matter of Example 11 includes, wherein the at least one tile comprises a touch sensor configured to receive user input related to the operations of the building.

In Example 13, the subject matter of Example 12 includes, wherein the operations of the building are selected from a group of operations that include: changing the information displayed, alerting a permanent occupant of the building of presence of an individual, and gaining entry to the building through use of a code to unlock the door.

In Example 14, the subject matter of Examples 11-13 includes, wherein the at least one tile includes a dual-sided display configured to provide different information to opposite sides of the transparent material.

In Example 15, the subject matter of Examples 10-14 includes, wherein a window of a venue includes the transparent material, and the information is related to an ongoing event at the venue.

In Example 16, the subject matter of Example 15 includes, wherein the ongoing event is a sporting event, and the information comprises a replay of a play of the sporting event overlaid on a field on which the play occurred in addition to at least one of further alphanumeric information about the play and images to highlight actions during the play.

In Example 17, the subject matter of Examples 10-16 includes, wherein a window of a shelter includes the transparent material, and the information includes travel-related information associated with the shelter.

In Example 18, the subject matter of Example 17 includes, wherein the shelter is a bus shelter, and the information includes at least one type of information selected from a group of information that includes bus schedules, next arrival time of each bus that is to use the bus shelter, bus routes to get to a place of interest, number of stops to reach the place of interest, and predicted arrival time to the place of interest.

In Example 19, the subject matter of Examples 10-18 includes, wherein the at least one tile includes a dual-sided display configured to provide different information to opposite sides of the transparent material.

In Example 20, the subject matter of Example 19 includes, wherein the information further includes advertisements.

Example 21 is a sparse display, comprising: at least one tile configured to display information, the at least one tile disposed at at least one location of within or on a transparent material, each of the at least one tile including: a transparent flexible substrate; a sparse array of individually-controllable micro light-emitting diodes (microLEDs) disposed on the transparent flexible substrate; and a transparent rigid substrate attached to the transparent flexible substrate; and at least one of the at least one tile includes, a user input configured to adjust information provided by the at least one tile or the information provided by the at least one tile is configured to be adjusted by a remote user input on a mobile device.

In Example 22, the subject matter of Example 21 includes, wherein the at least one tile includes a dual-sided display configured to provide different information to opposite sides of the transparent material.

In Example 23, the subject matter of Examples 21-22 includes, wherein: the at least one tile includes a first tile and a second tile adjacent to the first tile, the microLEDs within each of the first tile and the second tile are separated by a substantially uniform distance in substantially orthogonal directions, and the microLEDs at a common edge of the first tile and the second tile are separated by the substantially uniform distance.

Example 24 is a sparse display system, comprising: a plurality of tiles configured to display information, the plurality of tiles disposed at at least one location of within or on a transparent material, each tile including: a transparent flexible substrate; a sparse array of light-emitting diodes (microLEDs) disposed on the transparent flexible substrate, a distance between microLEDs of the sparse array configured to permit display of at least one of alphanumeric and image information while providing visibility through the transparent material; and a rigid substrate adhered to the transparent flexible substrate via an adhesive layer in which the sparse array of microLEDs is encapsulated; and at least one processor configured to control display by the plurality of tiles via at least one type of electrical communication coupled to the tiles.

In Example 25, the subject matter of Example 24 includes, wherein a surface of a vending machine includes the transparent material, and the information is related to products within the vending machine.

In Example 26, the subject matter of Example 25 includes, wherein at least one tile of the plurality of tiles is disposed at a location of the surface associated with a different product, and the information provided by the at least one tile is related to an associated product associated with the at least one tile.

In Example 27, the subject matter of Example 26 includes, wherein: the at least one tile comprises a touch sensor configured to receive user input for selection of a product associated with the at least one tile, and the processor is configured to adjust the information based on the user input received by the touch sensor.

In Example 28, the subject matter of Examples 24-27 includes, wherein a window of an appliance includes the transparent material, and the information is related to operations of the appliance.

In Example 29, the subject matter of Example 28 includes, wherein: at least one tile of the plurality of tiles comprises a touch sensor configured to receive user input related to the operations of the appliance; and the processor is configured to adjust the information based on the user input received by the touch sensor.

In Example 30, the subject matter of Examples 24-29 includes, wherein at least one of a window and a door of a building includes the transparent material, and the information is related to operations of the building.

In Example 31, the subject matter of Example 30 includes, wherein: at least one tile of the plurality of tiles comprises a touch sensor configured to receive user input related to the operations of the building; and the processor is configured to adjust the information based on the user input received by the touch sensor.

In Example 32, the subject matter of Example 31 includes, wherein the operations of the building are selected from a group of operations that include: changing the information displayed, alerting a permanent occupant of the building of presence of an individual, and gaining entry to the building through use of a code to unlock the door.

In Example 33, the subject matter of Examples 24-32 includes, wherein a window of a venue includes the transparent material, and the information is related to an ongoing event at the venue.

In Example 34, the subject matter of Example 33 includes, wherein the ongoing event is a sporting event, and the information comprises a replay of a play of the sporting event overlaid on a field on which the play occurred in addition to at least one of further alphanumeric information about the play and images to highlight actions during the play.

In Example 35, the subject matter of Examples 24-34 includes, wherein a window of a shelter includes the transparent material, and the information includes travel-related information associated with the shelter.

In Example 36, the subject matter of Example 35 includes, wherein the shelter is a bus shelter, and the information includes at least one type of information selected from a group of information that includes bus schedules, next arrival time of each bus that is to use the bus shelter, bus routes to get to a place of interest, number of stops to reach the place of interest, and predicted arrival time to the place of interest.

In Example 37, the subject matter of Examples 24-36 includes, wherein at least one tile of the plurality of tiles includes a dual-sided display configured to provide different information to opposite sides of the transparent material.

In Example 38, the subject matter of Example 37 includes, wherein the information further includes advertisements.

In Example 39, the subject matter of Examples 24-38 includes, wherein a window of a display case includes the transparent material, and the information is related to an object within the display case.

In Example 40, the subject matter of Examples 24-39 includes, wherein a window of an animal enclosure includes the transparent material, and the information is related to an animal within the enclosure.

Example 41 is a sparse display system, comprising: a plurality of tiles configured to display information, the plurality of tiles disposed at least one of within or on a transparent material, each tile including: a transparent flexible substrate; a sparse array of micro light-emitting diodes (microLEDs) disposed on the transparent flexible substrate, a distance between microLEDs of the sparse array configured to permit display of at least one of alphanumeric and image information while providing visibility through the transparent material; a transparent rigid substrate adhered to the transparent flexible substrate via an adhesive layer in which the sparse array of microLEDs is encapsulated; and at least one driver on an edge of the tile configured to drive the microLEDs of the tile; at least one processor configured to control display by the plurality of tiles via at least one electrical connection coupled to the at least one driver; and a touch sensor associated with at least one tile, the touch sensor configured to receive user input, the processor configured to adjust the information based on the user input received by the touch sensor.

In Example 42, the subject matter of Example 41 includes, wherein the plurality of tiles includes at least one tile having a plurality of sparse arrays configured to emit towards opposite sides of the transparent material to provide different information to the opposite sides of the transparent material.

In Example 43, the subject matter of Examples 41-42 includes, wherein: the transparent material is an outdoor display, and the plurality of tiles includes at least one tile having a plurality of sparse arrays configured to emit towards opposite sides of the transparent material to provide different information to the opposite sides of the transparent material.

In Example 44, the subject matter of Examples 41-43 includes, wherein: the transparent material is an indoor display, and the sparse array in each tile of the plurality of tiles is configured to emit towards a single side of the transparent material.

Example 45 is a sparse display system, comprising: a plurality of tiles configured to display information, the plurality of tiles disposed at least one of within or on a transparent material, each tile including: a transparent flexible substrate; a sparse array of micro light-emitting diodes (microLEDs) disposed on the transparent flexible substrate, a distance between microLEDs of the sparse array configured to permit display of at least one of alphanumeric and image information while providing visibility through the transparent material; and a transparent rigid substrate adhered to the transparent flexible substrate via an adhesive layer in which the sparse array of microLEDs is encapsulated; a remote user input configured to adjust information provided by at least one tile of the plurality of tiles; and at least one processor configured to control display by the plurality of tiles based on signals from the remote user input.

In Example 46, the subject matter of Example 45 includes, wherein: the plurality of tiles includes a first tile and a second tile adjacent to the first tile, the microLEDs within each of the first tile and the second tile are separated by a substantially uniform distance in substantially orthogonal directions, and the microLEDs at a common edge of the first tile and the second tile are separated by the substantially uniform distance.

Example 47 is at least one machine-readable medium including instructions that, when executed by processing circuitry, cause the processing circuitry to perform operations to implement of any of Examples 1-46.

Example 48 is an apparatus comprising means to implement of any of Examples 1-46.

Example 49 is a system to implement of any of Examples 1-46.

Example 50 is a method to implement of any of Examples 1-46.

While only certain features of the system and method have been illustrated and described herein, many modifications and changes will occur to those skilled in the art. It is, therefore, to be understood that the appended claims are intended to cover all such modifications and changes. Method operations can be performed substantially simultaneously or in a different order.

What is claimed is:

1. A sparse display, comprising:
   at least one tile configured to display information, the at least one tile disposed at at least one location within an indoor substantially transparent material, each of the at least one tile including:
      a substantially transparent flexible substrate;
      a sparse array of light-emitting diodes (microLEDs) disposed on the substantially transparent flexible substrate, a distance between microLEDs of the sparse array configured to display at least one of alphanumeric and image information while providing visibility through the substantially transparent material, a surface area of light-producing areas of the microLEDs being at most about 1% of a surface area of the sparse array;
      a substantially transparent rigid substrate adhered to the substantially transparent flexible substrate via an adhesive layer in which the sparse array of microLEDs is encapsulated; and
      at least one driver disposed on an edge of the tile and configured to drive the microLEDs of the tile.

2. The sparse display of claim 1, wherein a surface of a vending machine includes the substantially transparent material, and the information is related to products within the vending machine.

3. The sparse display of claim 2, wherein the at least one tile includes one or more tiles disposed at a location of the surface associated with a different product, and the information provided by the one or more tiles is related to an associated product associated with the one or more tiles.

4. The sparse display of claim 3, wherein:
   at least one of the one or more tiles comprises a touch sensor configured to receive user input for selection of the associated product, and
   a processor is configured to communicate with at least one type of sensor selected from a proximity sensor disposed in at least one location within the vending machine and an eye location detection sensor disposed in at least one other location within the vending machine to respectively detect a position or eye position of an individual proximate to the vending machine, the processor configured to reposition the image dependent on at least one of the position and an eye position of the individual to adjust an angle of emission using adjustment of at least one optical element in the one or more tiles.

5. The sparse display of claim 1, wherein a window of an appliance includes the substantially transparent material, and the information is related to operations of the appliance.

6. The sparse display of claim 5, wherein the at least one tile comprises a touch sensor configured to receive user input related to the operations of the appliance.

7. The sparse display of claim 1, wherein the at least one tile includes a dual-sided display configured to provide different information to opposite sides of the substantially transparent material.

8. The sparse display of claim 1, wherein a window of a display case includes the substantially transparent material, and the information is related to an object within the display case.

9. The sparse display of claim 8, wherein the at least one tile comprises a touch sensor configured to receive user input related to the object.

10. A sparse display, comprising:
at least one tile configured to display information, the at least one tile disposed at at least one location within an outdoor substantially transparent material, each of the at least one tile including:
a substantially transparent flexible substrate;
a sparse array of light-emitting diodes (microLEDs) disposed on the substantially transparent flexible substrate, a distance between microLEDs of the sparse array configured to display at least one of alphanumeric and image information while providing visibility through the substantially transparent material, a surface area of light-producing areas of the microLEDs being at most about 1% of a surface area of the sparse array;
a substantially transparent rigid substrate adhered to the substantially transparent flexible substrate via an adhesive layer in which the sparse array of microLEDs is encapsulated; and
at least one driver disposed on an edge of the tile and configured to drive the microLEDs of the tile.

11. The sparse display of claim 10, wherein at least one of a window and a door of a building includes the substantially transparent material, and the information is related to operations of the building.

12. The sparse display of claim 11, wherein the at least one tile comprises a touch sensor configured to receive user input related to the operations of the building.

13. The sparse display of claim 12, wherein the operations of the building are selected from a group of operations that include: changing the information displayed, alerting a permanent occupant of the building of presence of an individual, and gaining entry to the building through use of a code to unlock the door.

14. The sparse display of claim 11, wherein the at least one tile includes a dual-sided display configured to provide different information to opposite sides of the substantially transparent material.

15. The sparse display of claim 10, wherein a window of a venue includes the substantially transparent material, and the information is related to an ongoing event at the venue.

16. The sparse display of claim 15, wherein the ongoing event is a sporting event, and the information comprises a replay of a play of the sporting event overlaid on a field on which the play occurred in addition to at least one of further alphanumeric information about the play and images to highlight actions during the play.

17. The sparse display of claim 10, wherein a window of a shelter includes the substantially transparent material, and the information includes travel-related information associated with the shelter.

18. The sparse display of claim 17, wherein the shelter is a bus shelter, and the information includes at least one type of information selected from a group of information that includes bus schedules, next arrival time of each bus that is to use the bus shelter, bus routes to get to a place of interest, number of stops to reach the place of interest, and predicted arrival time to the place of interest.

19. A sparse display, comprising:
at least one tile configured to display information, the at least one tile disposed at at least one location within a substantially transparent material, each of the at least one tile including:
a substantially transparent flexible substrate;
a sparse array of individually-controllable micro light-emitting diodes (microLEDs) disposed on the substantially transparent flexible substrate, a surface area of light-producing areas of the microLEDs being at most about 1% of a surface area of the sparse array; and
a substantially transparent rigid substrate attached to the substantially transparent flexible substrate; and
at least one of the at least one tile includes a user input configured to adjust information provided by the at least one tile or the information provided by the at least one tile is configured to be adjusted by a remote user input on a mobile device.

20. The sparse display of claim 19, wherein the at least one tile includes a dual-sided display configured to provide different information to opposite sides of the substantially transparent material.

21. The sparse display of claim 19, wherein:
the at least one tile includes a first tile and a second tile adjacent to the first tile,
the microLEDs within each of the first tile and the second tile are separated by a substantially uniform distance in substantially orthogonal directions, and
the microLEDs at a common edge of the first tile and the second tile are separated by the substantially uniform distance.

22. The sparse display of claim 1, wherein the indoor substantially transparent material forms a front of a display case.

23. The sparse display of claim 3, wherein:
the information includes display of products,
a processor is configured to communicate with at least one type of sensor selected from a proximity sensor disposed in at least one location within the vending machine and an eye location detection sensor disposed in at least one other location within the vending machine to respectively detect a position or eye position of an individual proximate to the vending machine,
the processor is configured to determine a particular product in the vending machine in which the individual is interested dependent on at least one of the position and an eye position of the individual, and
in response to a determination that the particular product is sold out, the information further includes directions to a nearby machine that contains the particular product.

* * * * *